United States Patent [19]

Ishikawa et al.

[11] Patent Number: 5,696,389

[45] Date of Patent: Dec. 9, 1997

[54] LIGHT-EMITTING SEMICONDUCTOR DEVICE

[75] Inventors: Masayuki Ishikawa, Yokohama; Hideto Sugawara, Kawasaki; Yukie Nishikawa, Narashino; Masaaki Onomura, Tokyo; Shinji Saito, Yokohama; Peter James Parbrook, Kawasaki; Genichi Hatakoshi; Koichi Nitta, both of Yokohama; John Rennie, Tokyo; Hiroaki Yoshida, Yokohama; Atsushi Kamata, Chigasaki, all of Japan

[73] Assignee: Kabushiki Kaisha Toshiba, Kawasaki, Japan

[21] Appl. No.: 402,659

[22] Filed: Mar. 13, 1995

[30] Foreign Application Priority Data

Mar. 15, 1994 [JP] Japan ..................... 6-044451

[51] Int. Cl.⁶ .................. H01L 29/41; H01L 27/15; H01S 3/19
[52] U.S. Cl. .................. 257/99; 257/773; 372/44; 372/50
[58] Field of Search .............. 257/773, 99; 372/44, 372/50

[56] References Cited

U.S. PATENT DOCUMENTS

| 3,290,539 | 12/1966 | La Morte | 257/99 |
| 3,368,123 | 2/1968 | Rittman | 257/773 |
| 3,675,064 | 7/1972 | Coleman | 257/99 |
| 4,214,251 | 7/1980 | Schairer | 257/99 |
| 5,283,447 | 2/1994 | Olbright | 372/50 |

FOREIGN PATENT DOCUMENTS 5-21846  1/1993  Japan.

OTHER PUBLICATIONS

Japanese Journal of Applied Physics, vol. 30, No. 12A, S. Nakamura, et al., High–Power GaN P–N Junction Blue–Light –Emitting Diodes, pp. L1999–L2001.

*Primary Examiner*—Jerome Jackson
*Attorney, Agent, or Firm*—Oblon, Spivak, McClelland, Maier & Neustadt, P.C.

[57] ABSTRACT

A light-emitting semiconductor device comprising an n-type cladding layer provided on a surface of a substrate and having concentric first and second parts, a first electrode mounted on the first part of the n-type cladding layer, a p-type cladding layer provided above the surface of the substrate and surrounding the first electrode and the second part of the n-type cladding layer, and a second electrode provided on the p-type cladding layer.

21 Claims, 21 Drawing Sheets

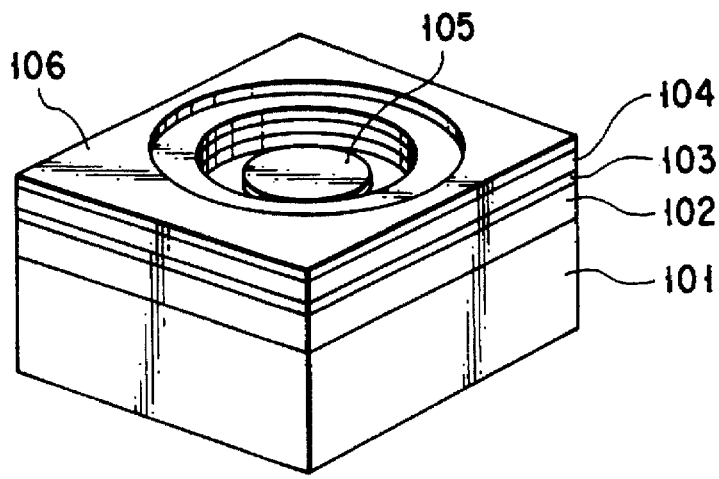
F I G. 1
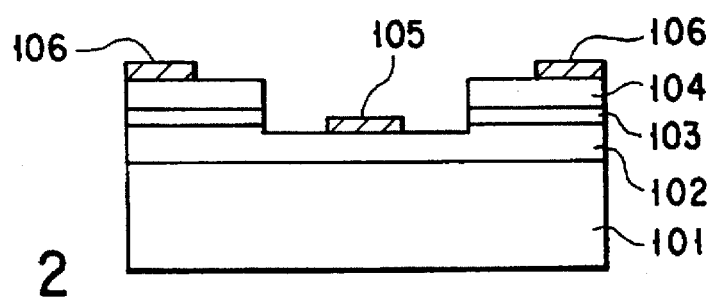
F I G. 2
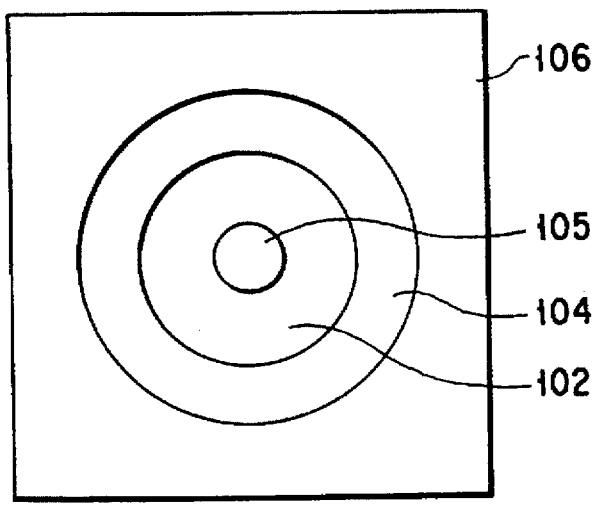
F I G. 3

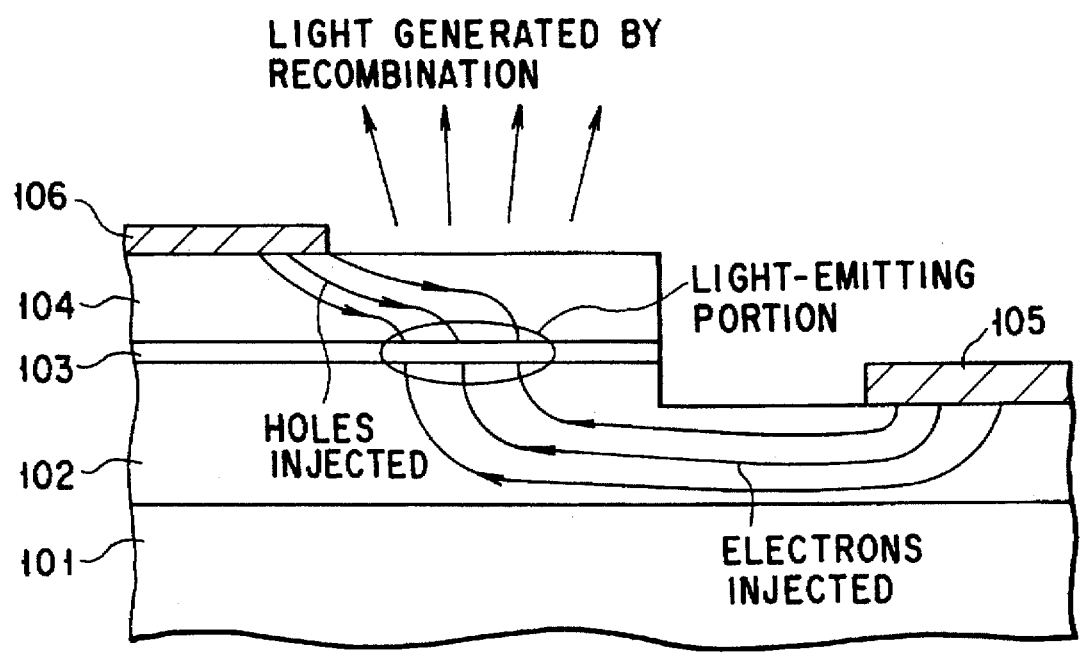
F I G. 4
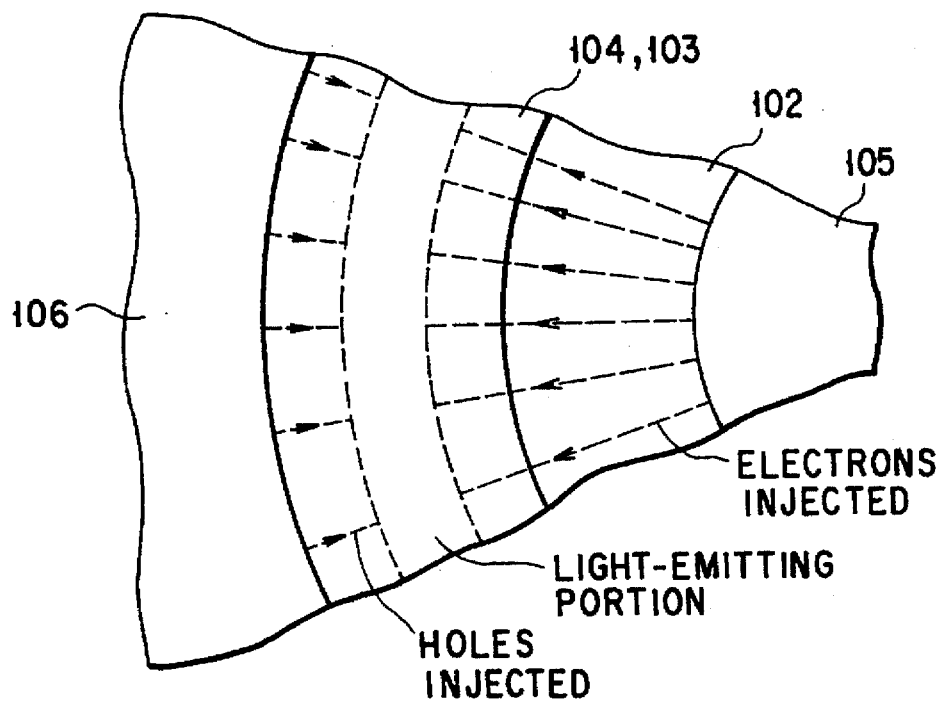
F I G. 5

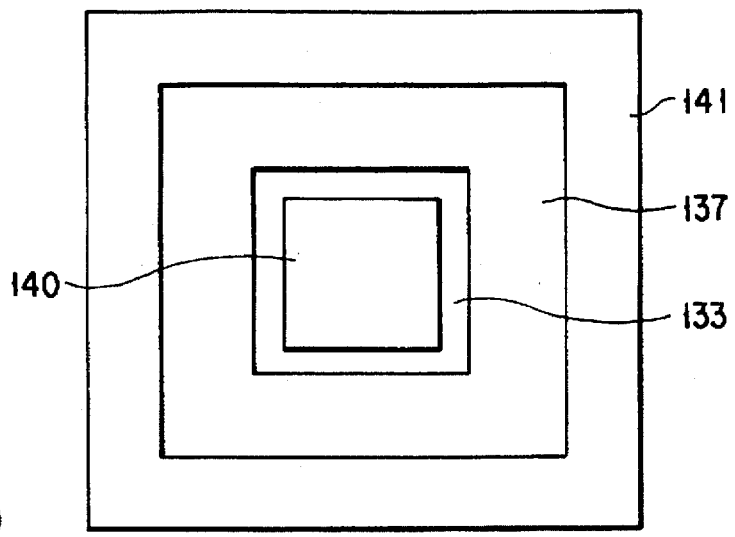
F I G. 9
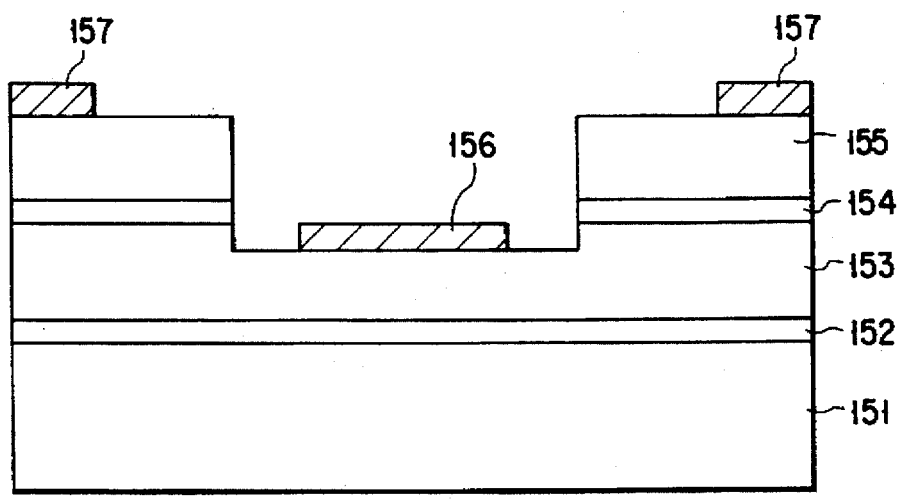
F I G. 10
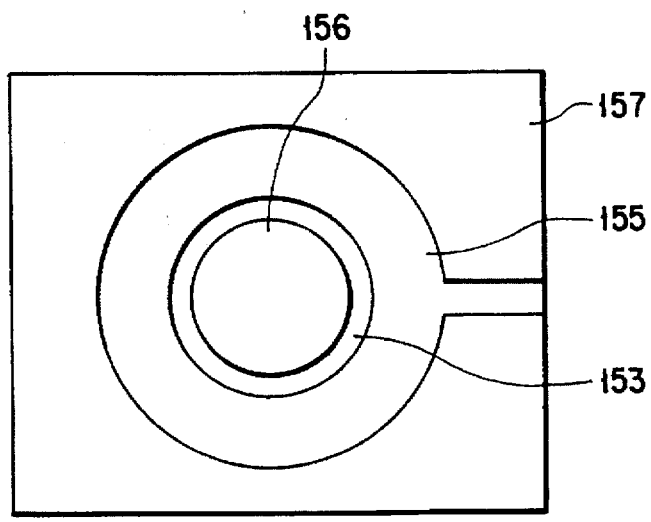
F I G. 11

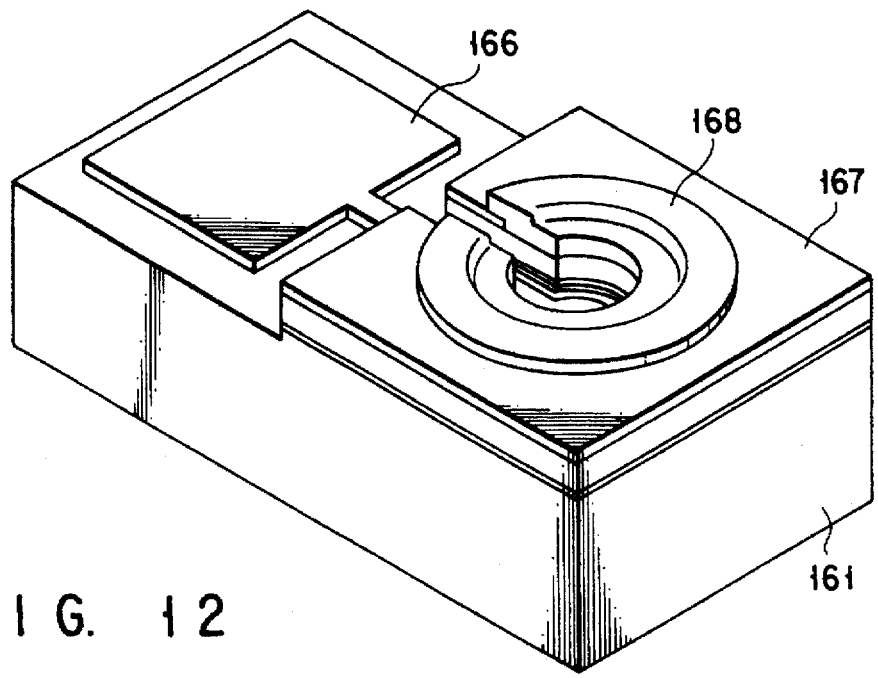
F I G. 12
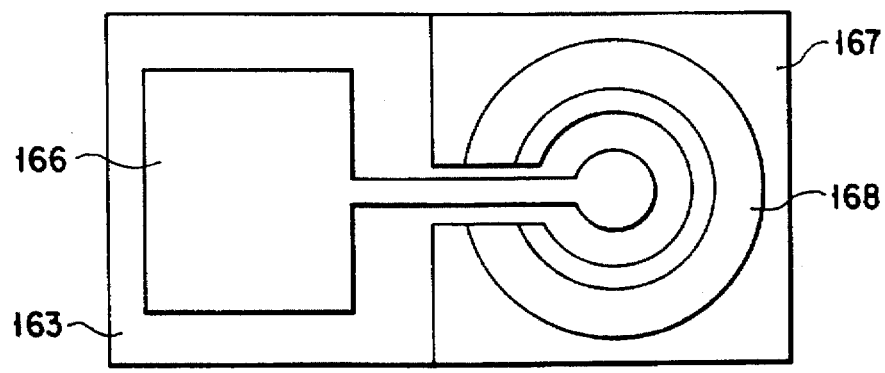
F I G. 13A
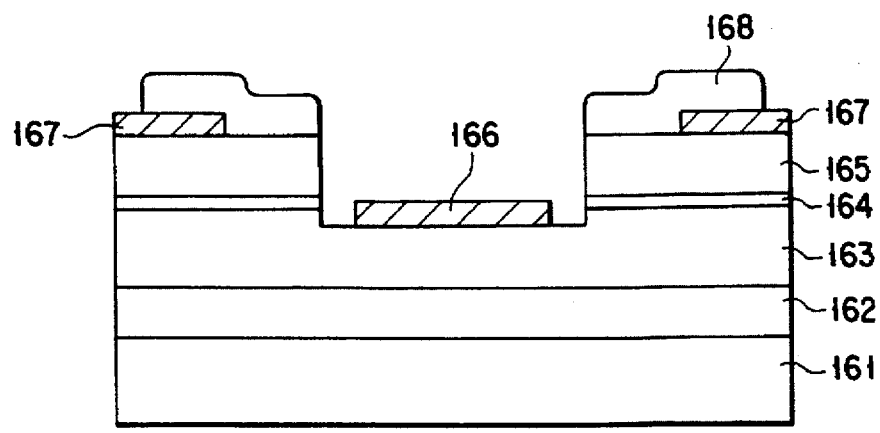
F I G. 13B

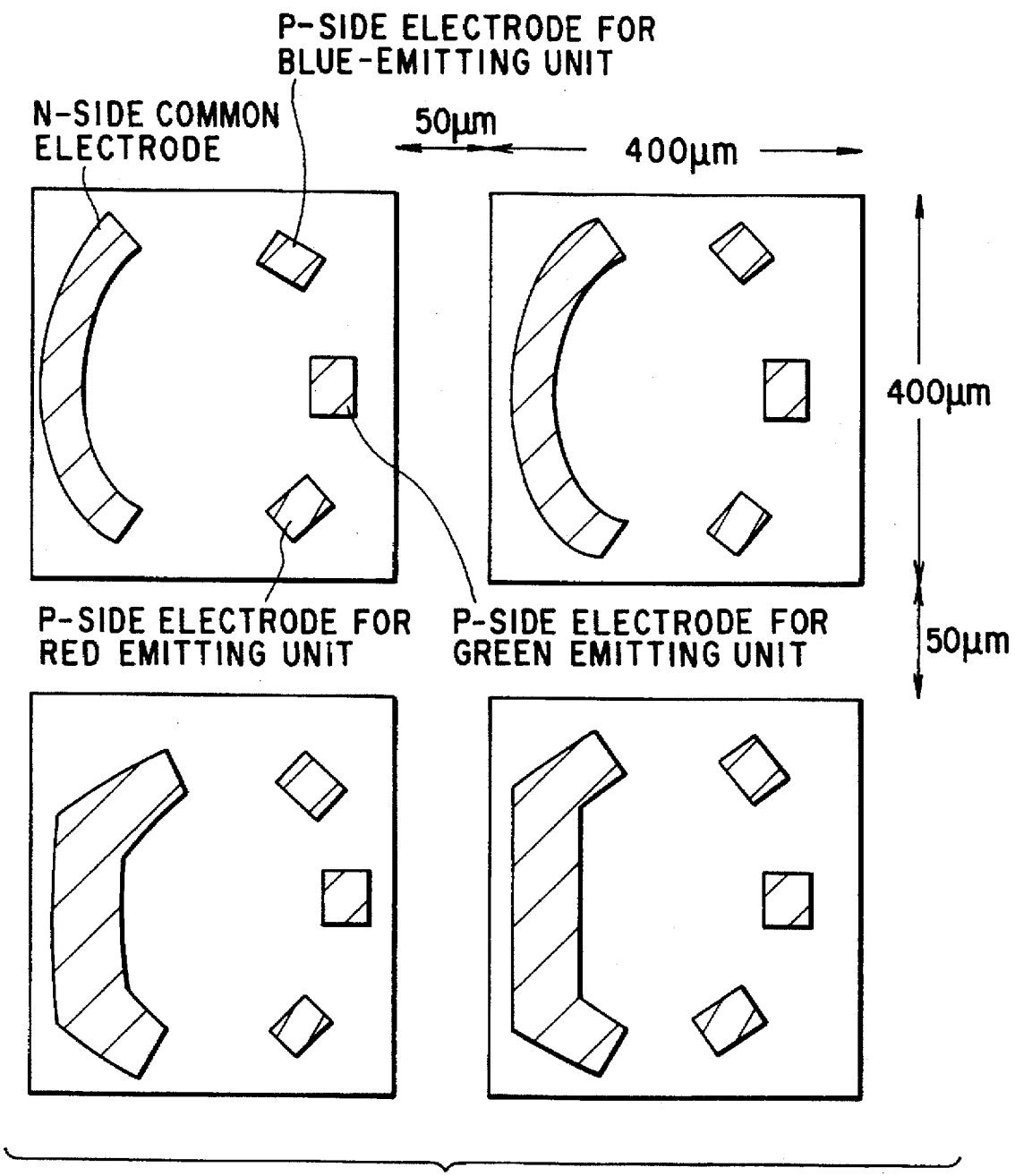
F I G. 26

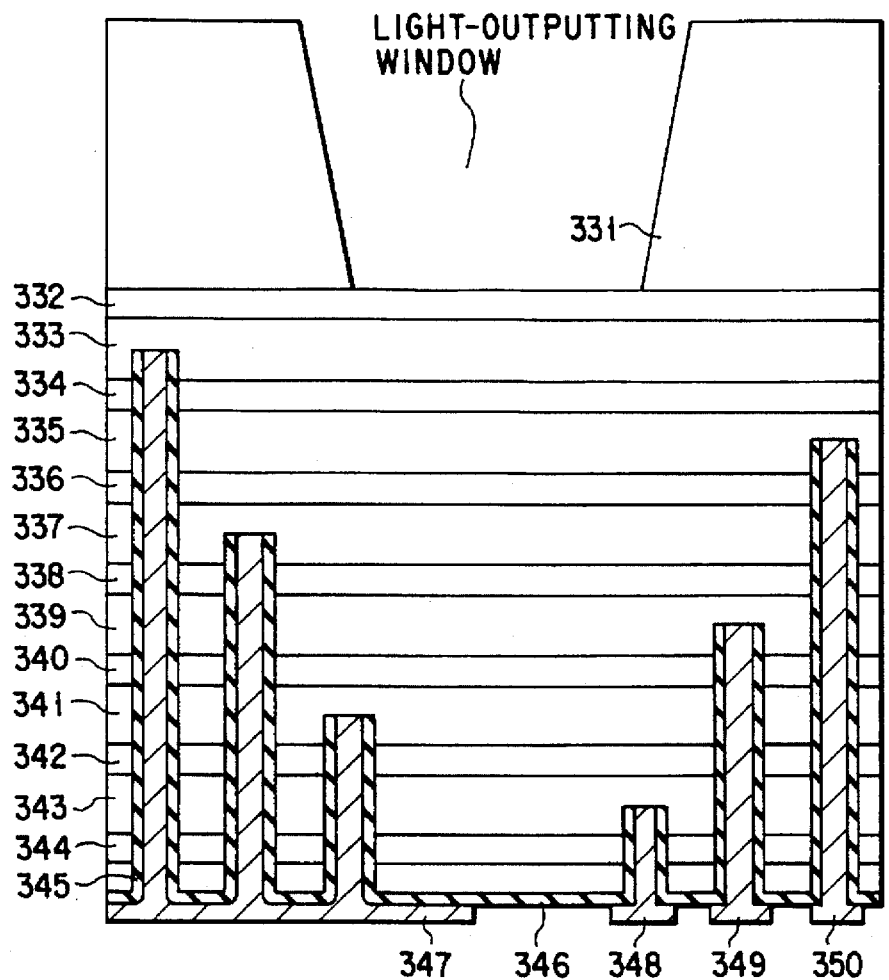
F I G. 27
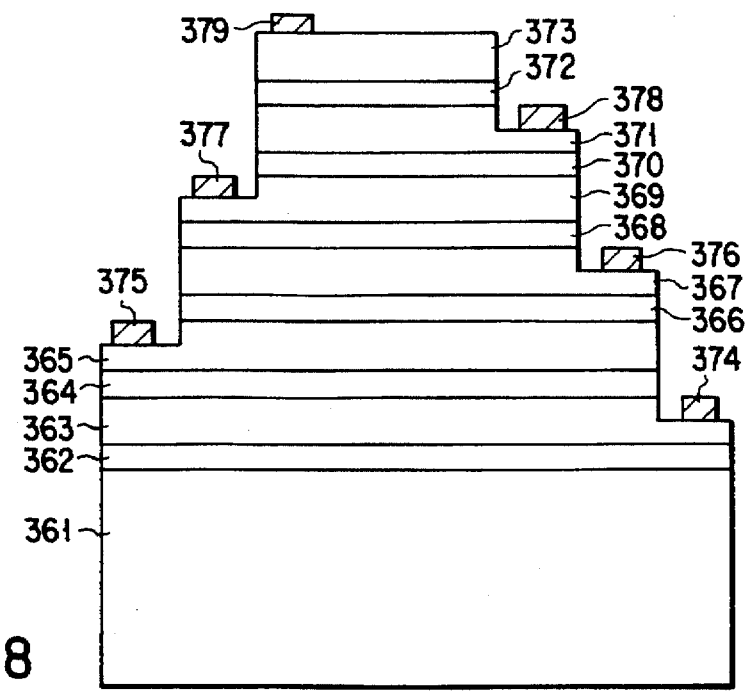
F I G. 28

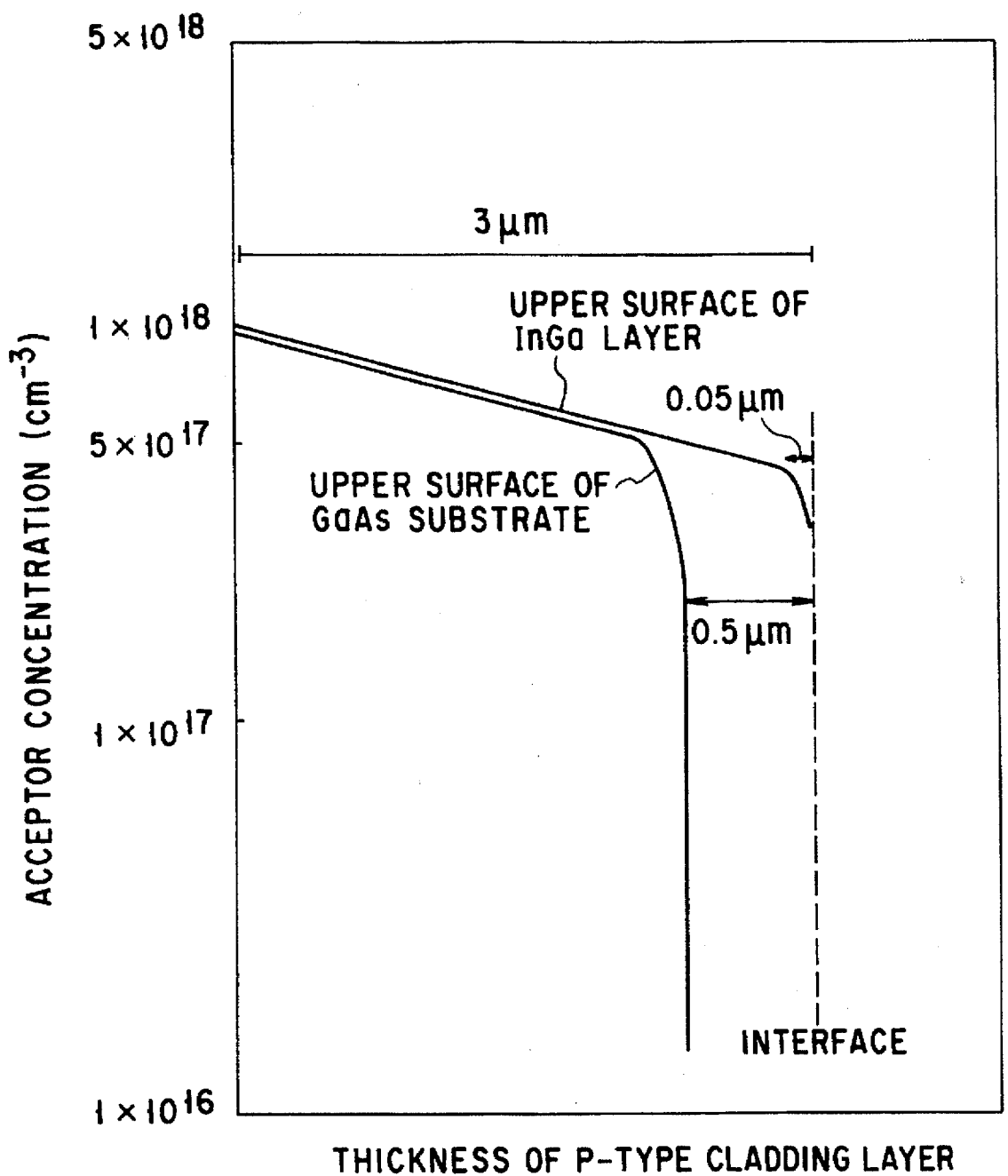
F I G. 32

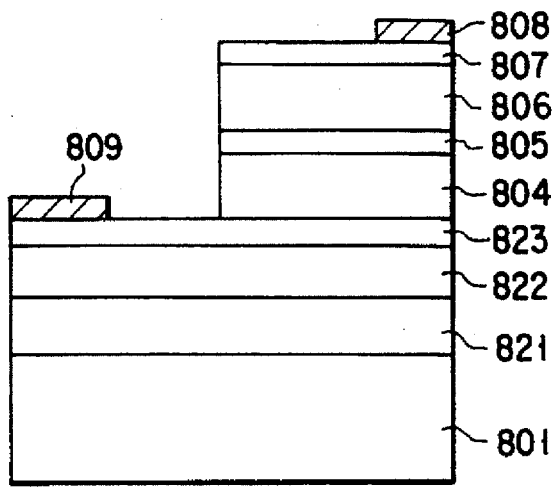
F I G. 45
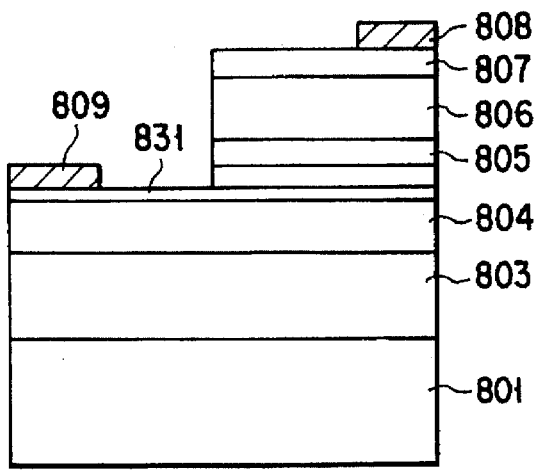
F I G. 46
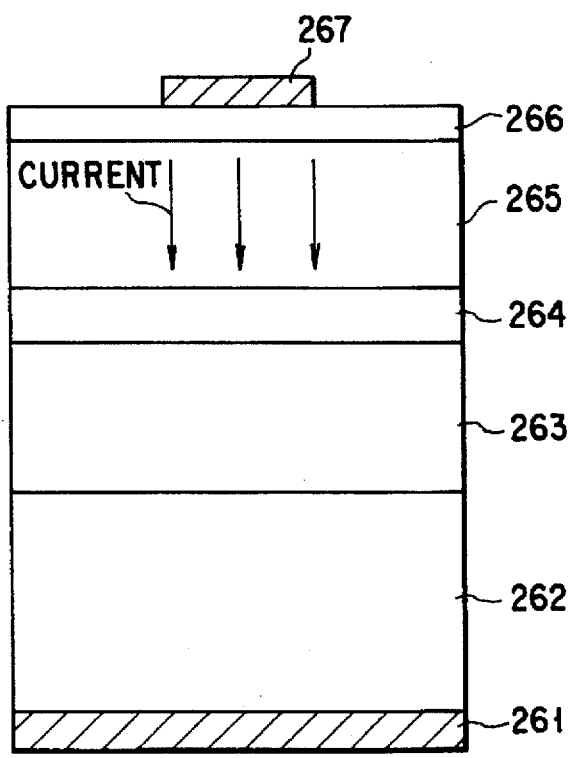
F I G. 47

LIGHT-EMITTING SEMICONDUCTOR DEVICE

BACKGROUND OF THE INVENTION

1. Field of the Invention

The present invention relates to a light-emitting semiconductor device having compound semiconductor components.

2. Description of the Related Art

Light-emitting diodes (LEDs) comprising various compound semiconductor components are known. FIG. 14 is a sectional view of a typical InGaAlP current-injection type LED hitherto known.

As FIG. 14 shows, the conventional LED comprises a n-type GaAs substrate 181 and a Bragg reflection layer 182 provided on the substrate 181. The Bragg reflection layer 182 is formed of an n-type InAlP film, an n-type GaAs film, an n-type AlP film and an n-type InGaP film. The LED further comprises an n-type InGaAlP cladding layer 183 provided on the Bragg reflection layer 182, an InGaAlP active layer 184 formed on the n-type cladding layer 183, a p-type InGaAlP cladding layer 185 mounted on the active layer 184, and an n-type InGaAlP current-blocking layer 186 provided on p-type cladding layer 185.

The n-type InGaAlP current-blocking layer 186 is shaped like a disc. A p-type GaAlAs current-diffusing layer 187 is formed on the current-blocking layer 186 and the exposed parts of the p-type cladding layer 185.

A p-type GaAs electrode contact layer 188 is formed on that portion of the p-type current-diffusing layer 187 which is located on the current-blocking layer 186. Further, a p-side electrode 189 made of AuZn/Au is provided on the p-type electrode contact layer 188. An n-side electrode 180 is provided on the lower surface of the n-type GaAs substrate 181.

The conventional LED thus structured exhibits external quantum efficiency of 1.2% and emits light having a luminosity intensity of 2.2 cd when it is driven by an operating current of 20 mA and emits yellow light having a wavelength of 592 nm. (See Japanese Journal of Applied Physics, Vol. 31, No. 8, pp. 2446–2451, 1992.)

The LED needs to attain a higher luminous efficiency in order to emit light having a ultra-high luminous intensity of 10 cd. However, the conventional LED can hardly attain such a high luminous efficiency. This is because a current cannot be uniformly injected through the p-side electrode 189 since the electrode 189 is arranged so as not to shield the light generated by electron-hole recombination. Namely, the farther any part of the LED is from the n-type InGaAlP current-blocking layer 186, the lower the current density in that part, and the lower the concentration of injected carriers therein. The lower the concentration of injected carriers, the more predominant the non-radiative recombination caused by non-radiation centers.

The density of injected carriers is very high in a part close to the n-type InGaAlP current-blocking layer 186. It is so high that electrons move from the layer 186 into the p-type InGaAlP cladding layer 185. This phenomenon is known as "electron overflow." The current generated by the electron overflow is a reactive current. Consequently, the LED fails to attain a sufficiently high luminous efficiency.

This problem is inherent not only in the LED having InGaAlP components, but also in KEDs having components of CdZnMgTeSeS-based II-VI compound semiconductor, InGaAlN-based III-V compound semiconductor, or SiC-based compound semiconductor.

SUMMARY OF THE INVENTION

The object of the present invention is to provide a light-emitting semiconductor device which has a high luminous efficiency though the current-injecting electrode is arranged so as not to shield the light generated by electron-hole recombination.

To achieve this object, there are provided the following light-emitting semiconductor devices according to the present invention:

A first light-emitting semiconductor device comprising: a compound semiconductor layer of a first conductivity type provided on a surface of a substrate and having first and second regions; a first electrode provided on the first region of the compound semiconductor layer of the first conductivity type; a compound semiconductor layer of a second conductivity type provided on the surface of the substrate, surrounding the first electrode and the second region of the compound semiconductor layer of the first conductivity type; and a second electrode provided on the compound semiconductor layer of the second conductivity.

A second light-emitting semiconductor device comprising: a II-VI compound semiconductor layer of a first conductivity type provided on a surface of a substrate; a first electrode provided on the II-VI compound semiconductor layer of the first conductivity type; a II-VI compound semiconductor layer of a second conductivity type provided on the surface of the substrate and contacting the II-VI compound semiconductor layer of the first conductivity type at a part remote from the first electrode; and a second electrode provided on the II-VI compound semiconductor layer of the second conductivity type.

A third light-emitting semiconductor device comprising: a cubic III-V compound semiconductor layer of a first conductivity type provided on a surface of a substrate; a first electrode provided on the III-V compound semiconductor layer of the first conductivity type; a III-V compound semiconductor layer of a second conductivity type provided on the surface of the substrate and contacting the III-V compound semiconductor layer of the first conductivity type at a part remote from the first electrode; and a second electrode provided on the III-V compound semiconductor layer of the second conductivity type.

The first, second and third light-emitting semiconductor divides may further comprises an active layer, to increase the advantage of this invention. Thus, the following light-emitting semiconductor devices can be provided according to the invention:

A fourth light-emitting semiconductor device comprising: a compound semiconductor layer of a first conductivity type provided on a surface of a substrate and having first and second regions; a first electrode provided on the first region of the compound semiconductor layer of the first conductivity type; an active layer provided on the compound semiconductor of the first conductivity type; a compound semiconductor layer of a second conductivity type provided on the surface of the substrate, surrounding the first electrode and the second region of the compound semiconductor layer of the first conductivity type and connected by the active layer to the compound semiconductor layer of the first conductivity type; and a second electrode provided on the compound semiconductor layer of the second conductivity.

A fifth light-emitting semiconductor device comprising: a II-VI compound semiconductor layer of a first conductivity type provided on a surface of a substrate; a first electrode provided on the II-VI compound semiconductor layer of the first conductivity type; an active layer provided on the II-VI compound semiconductor layer of the first conductivity type; a II-VI compound semiconductor layer of a second conductivity type provided on the surface of the substrate and connected by the active layer to the II-VI compound semiconductor layer of the first conductivity type at a 10 part remote from the first electrode; and a second electrode provided on the II-VI compound semiconductor layer of the second conductivity type.

A sixth light-emitting semiconductor device comprising: a cubic III-V compound semiconductor layer of a first conductivity type provided on a surface of a substrate; a first electrode provided on the III-V compound semiconductor layer of the first conductivity type; an active layer provided on the III-V compound semiconductor layer of the first conductivity type; a III-V compound semiconductor layer of a second conductivity type provided on the surface of the substrate and connected by the active layer to the III-V compound semiconductor layer of the first conductivity type at a part remote from the first electrode; and a second electrode provided on the III-V compound semiconductor layer of the second conductivity type.

The present inventors conducted researches, finding that a novel structure which may be called "surface-surrounded structure" to accomplish uniform injection of a current and ultimately to provide a light-emitting semiconductor device having a high luminous efficiency. The surface-surrounded structure has at least two compound semiconductor layers of opposite conductivity types which have an exposed surface each, and electrodes provided on the exposed surfaces of these compound semiconductor layers. This 10 structure is characterized in that one compound semiconductor layer of a first conductivity type has its exposed surface surrounded by the exposed surface of another compound semiconductor layer of a second conductivity type. The first semiconductor device of the invention, described above, is based on this finding of the inventors'. It follows that the device can have a sufficiently high luminous efficiency and emit greatly luminous light.

The inventors conducted other researches, finding that a so-called "surface contact structure" helps to achieve uniform injection of a current if it has components made of II-VI compound semiconductor or cubit III-V compound semiconductor. The surface contact structure has at least two compound semiconductor layers of opposite conductivity types which have an exposed surface each, and electrodes provided on the exposed surfaces of these compound semiconductor layers. Based on this finding of the inventors', the second and third semiconductor device of the invention can have a sufficiently high luminous efficiency and emit greatly luminous light.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a schematic perspective view of a light-emitting diode according to a first embodiment of the present invention;

FIG. 2 is a sectional view of the light-emitting diode shown in FIG. 1;

FIG. 3 is a plan view of the light-emitting diode shown in FIG. 1;

FIG. 4 is a sectional view explaining how electrons and holes injected into the surface-surrounded structure of FIGS. 1 to 3 recombine together to generate light;

FIG. 5 is a plan view explaining how electrons and holes injected into the surface-surrounded structure recombine together to generate light;

FIG. 9 is a plan view of the light-emitting diode shown in FIG. 8;

FIG. 10 is a schematic sectional view of a light-emitting diode according to a fifth embodiment of the invention;

FIG. 11 is a sectional view showing a modification of the light-emitting diode shown in FIG. 10;

FIG. 12 is a schematic perspective view of a surface emitting semiconductor laser according a sixth embodiment of the present invention;

FIG. 13A is a plan view of the semiconductor laser shown in FIG. 12;

FIG. 13B is a sectional view of the semiconductor laser shown in FIG. 12;

FIG. 26 is a plan view of a semiconductor device which comprises four primitive color emission devices of the type shown in FIG. 25;

FIG. 27 is a schematic sectional view of a primary color emitting device according to a fourteenth embodiment of the invention;

FIG. 28 is a schematic sectional view of a primary color emitting device according to a fifteenth embodiment of the present invention;

FIG. 32 is a graph illustrating how the profile of acceptor concentration of a p-type ZnSe cladding layer depends upon the underlayers;

FIG. 45 is a schematic sectional view of a light-emitting diode according to a twenty-fifth embodiment of the present invention;

FIG. 46 is a schematic sectional view of a light-emitting diode according to a twenty-sixth embodiment of the present invention;

FIG. 47 is a schematic sectional view of a conventional light-emitting diode.

DETAILED DESCRIPTION OF THE PREFERRED EMBODIMENTS

Figure 6:
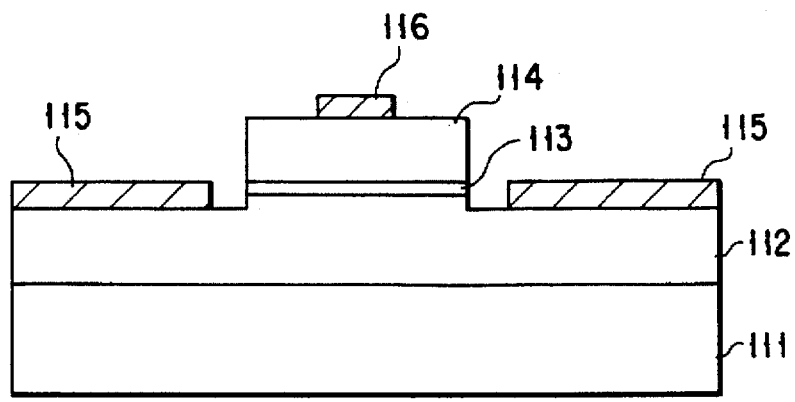
FIG. 6 is a schematic sectional view a light-emitting diode according to a second embodiment of the invention.

The present invention will be now be described in detail, with reference to embodiments shown in the accompanying drawings.

First Embodiment

FIGS. 1 to 3 are respectively a perspective view, a sectional view, and a plan view of an LED according to the first embodiment of the present invention.

As shown in FIGS. 1 and 2, the LED comprises a GaAs substrate 101, an n-type InGaAlP cladding layer 102 formed provided on the substrate 101, an InGaAlP active layer 103 provided on the n-type cladding layer 102, a p-type InGaAlP cladding layer 104 formed on the active layer 103, an n-side AuGe/Au electrode 105, and a p-side AuZn/Au electrode 106.

The p-type cladding layer 104 and the active layer 103 have concentric circular openings, which define an annular recess and expose the n-type cladding layer 102. The n-side electrode 105, shaped like a disc, is provided on the central part of the exposed surface of the n-type cladding layer 102. As a result, the n-type cladding layer 102 has an annular exposed surface is surrounded by the p-type cladding layer 104 and the active layer 103.

The p-type electrode 106 is formed on the p-type cladding layer 104. The p-side electrode 106 has a circular opening which is concentric to and larger than the opening of the p-type cladding layer 104. The electrode 106, therefore, has an annular exposed surface, which is surrounded by the p-type cladding layer 104.

As described above, the n-type cladding layer 102 has an annular exposed surface surrounded by the p-type cladding layer 104 and the active layer 103, and the p-type cladding layer 104 has an annular exposed surface surrounded by the p-side electrode 106. In view of this, the specific structure of the LED shall be called "surface-surrounded structure."

In the surface-surrounded structure, the GaAs substrate 101 has a high resistance. The n-type InGaAlP cladding layer 102 is lattice-matched with the GaAs substrate 101 and has a band gap of 2.3 eV, a thickness of 2 μm, and a donor concentration of $6\times10^{17}$ cm$^{-3}$. The InGaAlP active layer 103 is lattice-matched with the GaAs substrate 101 and has a band gap of 2.1 eV and a thickness of 0.3 μm. The p-type InGaAlP cladding layer 104 is lattice-matched with the GaAs substrate 101 and has a band gap of 2.3 eV, a thickness of 2 μm and an acceptor concentration of $8\times10^{17}$ cm$^{-3}$. The n-side electrode 105 shaped like a disc has a diameter of 100 μm. The annular exposed surface of the n-type cladding layer 102, i.e. the circular openings of the p-type cladding layer 104 and the active layer 103, has a diameter of 120 μm. The circular opening of the p-type electrode 106 has a diameter of 150 μm and is concentric to the disc-shaped n-side electrode 105. As is best shown in FIG. 3, the opening of the active layer 103, the opening of the p-type cladding layer 104, the n-side electrode 105, and the opening of the p-type cladding layer 104 are concentric to one another. As clearly seen from FIGS. 1, 2 and 3, the LED of the surface-surround structure is generally a square chip, having sides 250 μm long.

An LED of the type shown in FIGS. 1 to 3 was manufactured and driven with an operating current of 20 mA. The LED emitted light, exhibiting external 10 quantum efficiency of 12% at emission wavelength of 590 nm. Further the LED was resin-molded and tested. It emitted light having a luminous intensity as high as 1.5 cd. In other words, the LED emitted light of ultra-high luminance. This can be attributed to the surface-surrounded structure which is different from that of any light-emitting diode hitherto known.

FIGS. 4 and 5 are respectively a sectional view and a plan view, both explaining how electrons and holes are injected into the surface-surrounded structure of FIGS. 1 to 3 and how they recombine together to generate light.

As can be understood from FIGS. 4 and 5, the electrons and holes recombine and generate light in the light-emitting portion of the active layer 103. This portion is located underneath that portion of the p-type cladding layer 104 which is not covered with the p-type electrode 106. The light can thus be emitted from the LED, not shielded by the p-type electrode 106 or the n-side electrode 105. This is attained also due to the above-specified thickness and doping concentration of the n-type cladding layer 102 and the above-mentioned thickness and doping of the p-type cladding layer 104.

In other words, the size and position of the light-emitting portion can easily be adjusted by controlling the sheet resistance of the n-type cladding layer 102 and the sheet resistance of the p-type cladding layer 104. (The sheet resistance of each cladding layer is the product of the thickness and resistivity of the layer, and the resistivity is determined by the doping concentration of the layer.) To be more specific, the sheet resistance ratio of the n-type cladding layer 102 to the p-type cladding layer 104 is set at a desired value. If the sheet resistance ratio is less than the desired value, the light-emitting portion will be located near the p-side electrode 106 and covered in part by the p-side electrode 106, and the luminous efficiency of the LED will decrease. Conversely, if the sheet resistance is greater than the desired value, the emitting portion will be located close to the annular recess defined by the circular openings of the p-type cladding layer 104 and the active layer 103, and electrons and holes will more readily recombine in the exposed portion of the active layer 103, inevitably jeopardizing the reliability of the LED.

In the surface-surrounded structure, a current flows in all directions. Therefore, the electron current has a high density, and the hole current a low density. The density of the electron current is maximum near the n-side electrode 105 and gradually decreases away from the electrode 105. On the other hand, density of the hole current has its highest value near the p side electrode 106 and gradually increases away from the p-side electrode 106. Hence, the current injected into the light-emitting portion is uniform in magnitude.

In the cladding layers 102 and 104 and the active layer 103, the current density can be rendered higher near the p-side electrode 106 than near the n-side electrode 105. This current-density gradient reduces an voltage drop at the p-side electrode 106 where the ohmic contact is likely to increase. Thus, the current-density gradient serves to lower the operating voltage for the LED. Moreover, the current-density gradient inhibits heat generation, ultimately preventing a decrease in the luminous efficiency of the LED.

The advantages described above have derived, all from the surface-surrounded structure which comprises at least two compound semiconductor layers of different conductivity types, each having an exposed surface, and electrodes provided on the exposed surfaces of the compound semiconductor layers, and in which the exposed surface of the compound semiconductor layer having one conductivity type is surrounded by the exposed surface of the compound semiconductor layer of the other conductivity type, thereby not to shield light being emitted outwards.

The first embodiment has components made of InGaAlP-based compound semiconductor. Nonetheless, it can achieve the same advantages even if it comprises components made of any other compound semiconductor.

Figure 48:
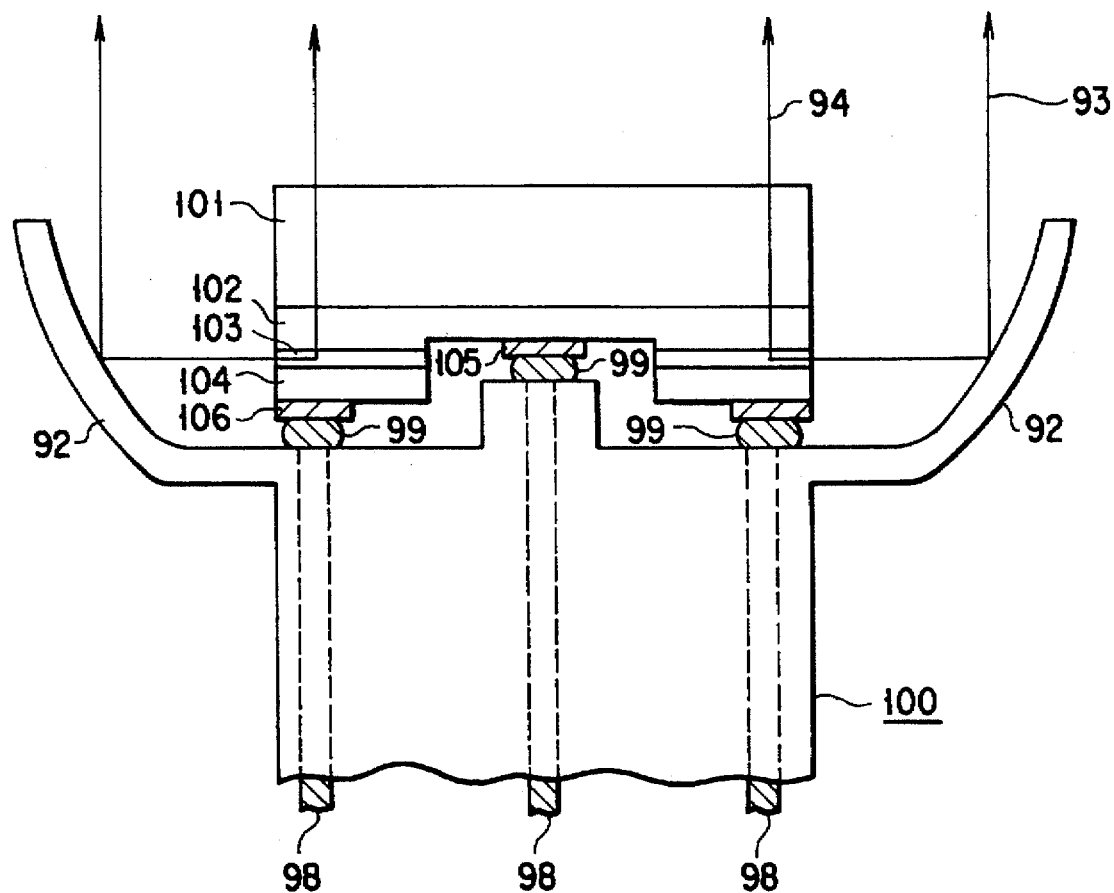
FIG. 48 is a sectional view of a modification of the first embodiment.

FIG. 48 is a sectional view of an LED which is a modification of the first embodiment, in which the electrodes 105 and 106 are connected by a bonding pad 99 to a wiring 98 provided on an insulating substrate (wiring substrate), and a reflector 92 is connected to a wiring substrate 100 and surrounds the sides of the LED. When operated, the LED emits light not only from the rear end, but also from the sides. The light beams 93 emitted from the sides are reflected by the reflector 92 and hence are taken from the front along with the light beams 94 emitted from the rear end.

This specific structure is useful, particularly when applied to a light-emitting element which can have a substrate transparent to the light emitted—such as an element which comprises a sapphire substrate and an InGaAlN-based semiconductor layers formed on the sapphire substrate, or an element which comprises a ZnSe substrate and ZnSe-based semiconductor layers formed on the ZnSe substrate.

Second Embodiment

FIG. 6 is a schematic sectional view an LED according to the second embodiment of the invention. As shown in FIG. 6, this LED comprises a GaAs substrate 111, a p-type InGaAlP cladding layer 112 provided on the GaAs substrate 111, an InGaAlP active layer 113 formed on the p-type cladding layer 112, an n-type InGaAlP cladding layer 114 formed on the active layer 113, a p-side AuZn/Au electrode 115 provided on the p-type cladding layer 112, and an n-side AuGe/Au electrode 115 formed on the n-type cladding layer 114.

The active layer 113 and the n-type cladding layer 114 are discs positioned concentric to each other. The p-side electrode 115 has a circular opening made in the central part. The opening is larger than the active layer 113 and the n-type cladding layer 114. The p-type cladding layer 112 comes to have an annular exposed surface, which surrounds the active layer 113 and the n-type cladding layer 114.

The LED further comprises an n-side electrode 116 which is shaped like a disc and provided on the central part of the n-type cladding layer 114. The n-type cladding layer 114 comes to have an annular exposed surface, which surrounds the n-side electrode 116, turn is concentric to the active layer 113.

As is evident from FIG. 6, the LED has a surface-surrounded structure, too. In this surface-surrounded structure, the GaAs substrate 111 has a high resistance. The n-type InGaAlP cladding layer 112 is lattice-matched with the GaAs substrate 111 and has a band gap of 2.3 eV, a thickness of 2 μm, and an acceptor concentration of $8 \times 10^{17}$ $cm^{-3}$. The InGaAlP active layer 113 is lattice-matched with the GaAs substrate 111 and has a band gap of 2.1 eV and a thickness of 0.3 μm. The p-type InGaAlP cladding layer 114 is lattice-matched with the GaAs substrate 111 and has a band gap of 2.3 eV, a thickness of 2 μm and a donor concentration of $6 \times 10^{17}$ $cm^{-3}$. The n-side electrode 116 has a diameter of 100 μm. The active layer 113 and the n-type cladding layer 114 have the same diameter of 120 µm. The annular exposed surface of the n-type cladding layer 112 has an outer diameter of 150 µm. The active layer 113, the n-type cladding layer 114, the opening of the p-side electrode 115, and the n-side electrode 116 are concentric to one another. The LED is generally a square chip, having sides 250 µm long.

An LED identical to the one shown in FIG. 6 was manufactured and driven with an operating current of 20 mA. The LED emitted light, exhibiting external quantum efficiency of 8% at emission wavelength of 590 nm. Further the LED was resin-molded and tested; it emitted light of luminous intensity as high as 10 cd. That is, the LED emitted light of much higher luminance than any conventional LED can. This can be attributed to the surface-surrounded structure.

The LED according to the second embodiment can be driven by a lower operating voltage lower and has a higher luminous efficiency than the LED of the third embodiment which will be described below. This is because the p-side electrode 115 is located closer to the substrate 111 than the n-side electrode 116.

Third Embodiment

Figure 7:
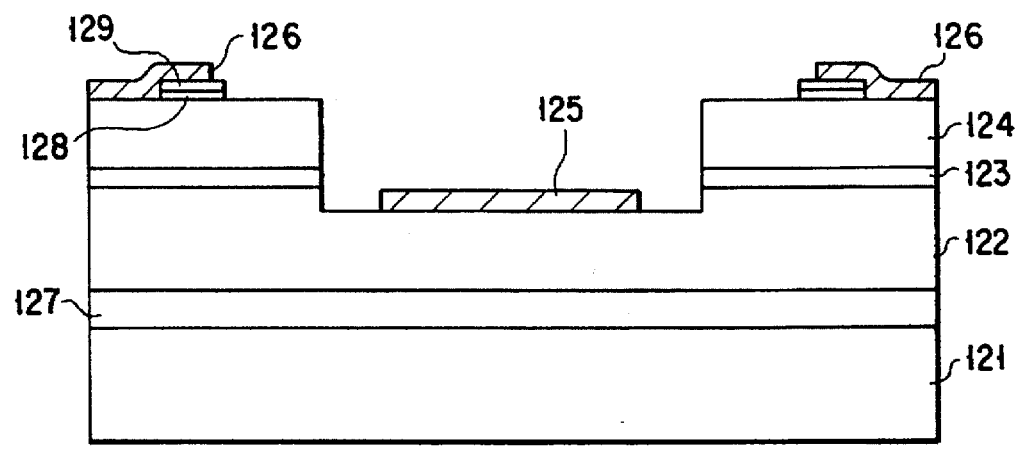
FIG. 7 is a schematic sectional view a light-emitting diode according to a third embodiment of the invention.

FIG. 7 is a schematic sectional view an LED according to a third embodiment of the invention.

As shown in FIG. 7, the LED comprises a GaAs substrate 121, a Bragg reflection layer 127 formed on the GaAs substrate 121, an n-type InGaAlP cladding layer 122 provided on the Bragg reflection layer 127, an InGaAlP active layer 123 formed on the n-type cladding layer 122, a p-type InGaAlP cladding layer 124 formed on the active layer 123, an n-side AuGe/Au electrode 125 provided on the n-type cladding layer 122, a p-type AuZn/Au electrode 126 formed on the p-type cladding layer 124.

The active layer 123 and the p-type cladding layer 124 have circular openings in their central parts. These openings have the same diameter and are concentric to each other. The n-type cladding layer 122 has a circular surface exposed through these openings. On this circular exposed surface, the n-side electrode 125 is provided. The n-side electrode 125 is shaped like a disc. Therefore, the n-type cladding layer 122 has an annular exposed surface.

The LED further comprises a layer 128 and an ohmic contact layer 129. The layer 128 is interposed between the p-type cladding layer 124 and the p-side electrode 126, for reducing the height of a hetero-barrier. (The layer 128 shall be referred to as "hetero-barrier reducing layer.") The ohmic contact layer 129 is interposed between the hetero-barrier reducing layer 128 and the p-side electrode 126. The p-side electrode 126, the hetero-barrier reducing layer 128 and the ohmic contact layer 129 have circular openings which have substantially the same diameter and which are concentric to the circular openings of the active layer 123 and the p-type cladding layer 124. The diameters of the electrode 126 and the layers 128 and 129 are larger than the diameter of the circular openings of the active layer 123 and the p-type cladding layer 124. As a result, the p-cladding layer 124 has an annular exposed surface.

The Bragg reflection layer 127 is comprised of 10 InAl/GaAs films and 10 InAlP/InGaAlP films which are formed one upon another. The n-type InGaAlP cladding layer 122 is lattice-matched with the GaAs substrate 121 and has a band gap of 2.35 eV, a thickness of 2 µm, and a donor concentration of $6 \times 10^{17}$ cm$^{-3}$. The InGaAlP active layer 123 is lattice-matched with the GaAs substrate 121 and has a band gap of 2.2 eV and a thickness of 0.3 µm. The p-type InGaAlP cladding layer 124 is lattice-matched with the GaAs substrate 121 and has a band gap of 2.35 eV, a thickness of 2 µm and an acceptor concentration of $8 \times 10^{17}$ cm$^{-3}$. The n-side electrode 125 is a disc having a diameter of 100 µm. The annular exposed surface of the n-type cladding layer 122 has a diameter of 120 µm. The circular opening of the p-side electrode 126 has a diameter of 150 µm. The disk-shaped n-side electrode 125 and the openings of the active layer 123, the n-type cladding layer 124, the n-type cladding layer 124, the p-side electrode 126, the hetero-barrier reducing layer 128 and the ohmic contact layer 129 are concentric to one another. The LED is generally a square chip, having sides 250 µm long.

An LED of the type shown in FIG. 7 was made and driven with an operating current of 20 mA. The LED emitted light, exhibiting external quantum efficiency of 10% at emission wavelength of 563 nm. Further the LED was resin-molded and tested. It emitted light having luminous intensity as high as 20 cd. In other words, the LED emitted light of very high luminance.

In the LED according to the third embodiment, the light beams traveling toward the GaAs substrate 121 are reflected by the Bragg reflection layer 127. More light can be emitted from the surface of the LED than in the case of the first embodiment.

As shown in FIG. 7, the hetero-barrier reducing layer 128 and the ohmic contact layer 128 are interposed between the n-type cladding layer 124 and the p-side electrode 126. Thanks to this structural feature, the voltage drop between the electrodes 125 an 126 further decreases, inhibiting heat generation and ultimately enhancing the luminous efficiency of the LED. Thus, the LED according to the third embodiment proves that the luminous efficiency can be increased by a combination of the techniques employed in the conventional LEDs and the techniques specific to the present invention.

The current can be made to flow thorough the n-type cladding layer 122, thereby to attain an optimal current density by two alternatively methods. The first method is to replace the Bragg reflection layer 127 with a layer which has a high resistance or which is of p-type. The second method is to use a hetero-barrier which is formed between the GaAs substrate 121 and the n-type InGaAlP cladding layer 122.

Furthermore, the Bragg reflection layer 127 and the substrate 121, both located beneath the n-type cladding layer 122, may of the same conductivity type as the n-type cladding layer 122. In this case, a current can be injected into the substrate 121 with high efficiency, thereby to raise the operating efficiency of the LED.

In the first to third embodiments, each component layer may be of the conductivity type opposite to the type specified above, provided the layer assumes the same position with respect to the other component layers. Needless to say, even if the conductivity type of each layer is altered, the advantages of the invention will be attained. Further, the active layer made of InGaAlP may of course be replaced by an active layer which has either a quantum well or a strained quantum well. Moreover, the components of the LEDs according to the first to third embodiments need not be made of InGaAlP-based material to achieve the advantages specified above. Rather, they can be made of other materials.

Fourth Embodiment

Figure 8:
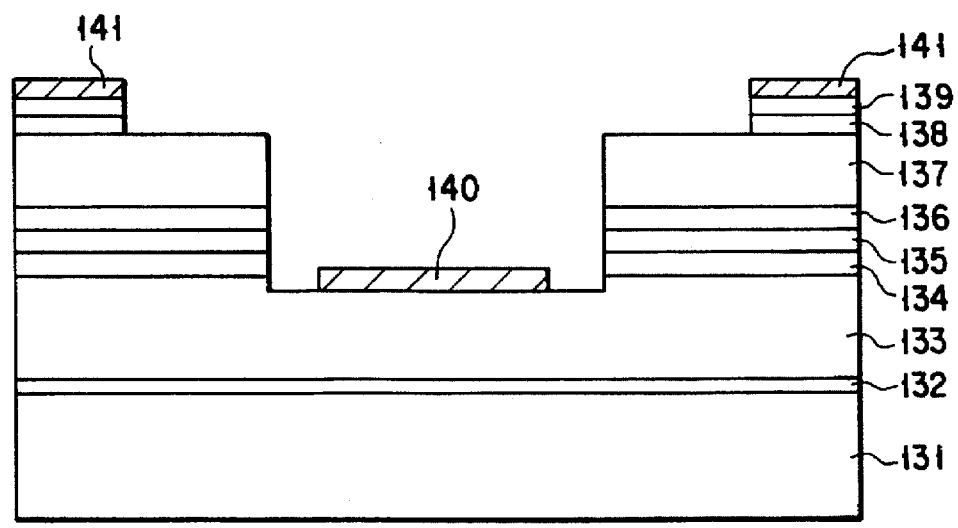
FIG. 8 is a schematic sectional view a light-emitting diode according to a fourth embodiment of the invention.
Figure 14:
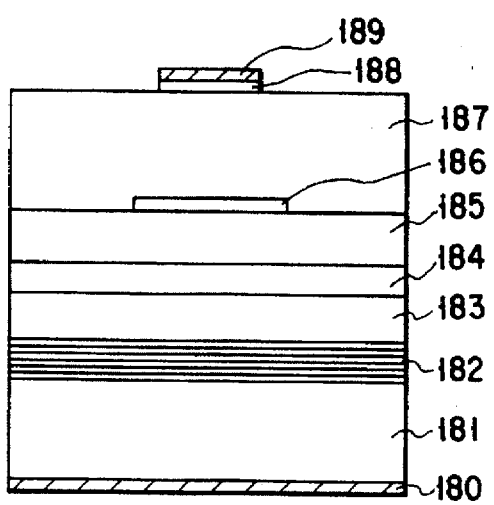
FIG. 14 is a schematic sectional view of a conventional light-emitting diode.

FIGS. 8 and 9 are a sectional view and a plan view, showing a light-emitting diode according to the fourth embodiment of the present invention.

As shown in FIGS. 8 and 9, the LED comprises a GaAs substrate 131, a ZnSe buffer layer 132 formed on the substrate 131, an n-type ZnSeS contact layer 133 provided on the buffer layer 132, and an n-type ZnMgSe cladding layer 134 provided on the n-type contact layer 133. The LED further comprises an active layer 135 having a CdZnSe/ZnSeS strained quantum well and formed on the n-type cladding layer 134, a p-type ZnMgSeS cladding layer 136 formed on the active layer 135, and a p-type ZnSeS light-outputting layer 137 provided on the p-type cladding layer 136.

The substrate 131, the buffer layer 132, the n-type cladding layer 134, the n-type cladding layer 134, the active layer 135, the p-type cladding layer 136, and the light-outputting layer 137 are square layers as can be seen from FIG. 9. Of these layers, the layers 10 134, 135, 136 and 137 have square openings which have the same size and which are vertically aligned. The n-type contact layer 133 located beneath the layer 134 has a square exposed surface, and the light-outputting layer 137 has a frame-shaped exposed surface.

The LED still further comprises a hetero-barrier reducing layer 138 formed on the frame-shaped exposed surface of the light-outputting layer 137 and having a p-type ZnSe/ZnTeSe/ZnTe superlattice, a p-type ZnTe contact layer 139 provided on the hetero-barrier reducing layer 138, an n-side Ti/Au electrode 140 provided on the square exposed surface of the n-type contact layer 133, and a p-side Ti/Au electrode 141 formed on the p-type contact layer 139.

As can be understood from FIG. 9, the layers 138 and 139 and the p-side electrode 141 have square openings which have the same size and are vertically aligned. These square openings are larger than the square openings of the layers 135, 136 and 137. The light-outputting layer 137 has therefore a frame-shaped exposed surface.

The n-side electrode 140 provided on the square exposed surface of the n-type contact layer 133 is a square layer. The sides of the electrode 140 is shorter than the sides of the square exposed surface of the n-type contact layer 133. Thus, the n-type contact layer 133 ultimately has a frame-shaped exposed surface.

In the structure shown in FIGS. 8 and 9, the ZnSe buffer layer 132 has a thickness of 10 µm, the n-type ZnSeS contact layer 133 is lattice-matched with the GaAs substrate 131 and has thickness of 2 µm and a donor concentration of $6 \times 10^{17}$ cm$^{-3}$. The n-type ZnMgSeS cladding layer 134 is lattice-matched with the GaAs substrate 131 and has a thickness of 0.5 µm and a donor concentration of $6 \times 10^{17}$ cm$^{-3}$. The active layer 135 has a CdZnSe/ZnSeS strained quantum well. The p-type ZnMgSeS cladding layer 136 is lattice-matched with the GaAs substrate 131 and has a thickness of 0.5 µm and an acceptor concentration of $4 \times 10^{17}$ cm$^{-3}$. The p-type ZnSeS light-outputting layer 137 is lattice-matched with the GaAs substrate 131 and has a thickness of 2 µm and an acceptor concentration of $6 \times 10^{17}$ cm$^{-3}$. The hetero-barrier reducing layer 138 has a p-type ZnSe/ZnTeSe/ZnTe superlattice. The p-type ZnTe contact layer 139 has a thickness of 20 nm and an acceptor concentration of $2 \times 10^{18}$ cm$^{-3}$. The n-side electrode 140 is a square layer having sides, each 100 µm long. The frame-shaped exposed surface of the n-type contact layer 133 has sides, each 120 µm long. The frame-shaped exposed surface of the light-outputting layer 137 is concentric to the n-side electrode 140 and has sides, each 150 µm. The LED having this specific structure is generally a square chip, having sides 250 µm long.

An LED of the type shown in FIGS. 8 and 9 was manufactured and driven with an operating current of 20 mA. The LED emitted light, exhibiting external quantum efficiency of 12% at emission wavelength of 490 nm. Further the LED was resin-molded and tested. It emitted light of luminous intensity as high as 10 cd. Thus, this LED was proved to possess very high luminous efficiency.

The high luminous efficiency of the fourth embodiment made of CdZnMgTeSeS-based material can be attributed to three advantages features. First, the voltage drop at the p-type ohmic contact is substantially decreased. Second, neither electrode shields the light generated. Third, uniform current injection can be accomplished.

In the fourth embodiment, the active layer is of the type which has a strained quantum well. Nonetheless, the active layer may be a bulk active layer, in which case the luminous efficiency can be enhanced very much, as was proved by the experiment the inventors conducted. Furthermore, the active layer may contain an impurity, such as Te, which forms an emission recombination center. Moreover, the square n-side electrode 140 and the p-side electrode 141 shaped like a square frame can be replaced by electrodes of any other polygonal shape (e.g., hexagonal ones), provided that they define a surface-surrounded structure.

Fifth Embodiment

FIGS. 10 and 11 are respectively a schematic sectional view and a plan view of an LED according to the fifth embodiment of this invention.

As illustrated in FIG. 10, the LED comprises a sapphire substrate 151, a GaN buffer layer 152 formed on the substrate 151, an n-type GaN cladding layer 153 provided on the buffer layer 152, a InGaN active layer 154 mounted on the n-type cladding layer 153, and a p-type GaN cladding layer 155 formed on the active layer 154. As seen from FIG. 11, the active layer 154 and the p-type cladding layer 155 have concentric circular openings, exposing the central part of the n-type cladding layer 153. The n-type cladding layer 153 therefore has a circular exposed surface.

The LED further comprises an n-side Al electrode 156 and a p-side Pt/Ti/Pt/Au electrode 157. The n-side electrode 156 is a disc formed on the circular exposed surface of the n-type cladding layer 153 and located concentric thereto. As a result, the n-type cladding layer 153 has an annular exposed surface. The p-side electrode 157 is provided on the p-side electrode 157. It has a circular opening concentric to the n-side electrode 156, as is best shown in FIG. 11. Hence, the p-type cladding layer 155 has an annular exposed surface.

In the structure of FIGS. 10 and 11, the GaN buffer layer 152 has a thickness of 20 nm, and the n-type GaN cladding layer 153 has a thickness of 5 µm and a donor concentration of $4 \times 10^{17}$ cm$^{-3}$. The p-type InGaN active layer 154 has a thickness of 20 nm and an In composition ratio of 0.1. The p-type GaN cladding layer 155 has a thickness of 1 µm and an acceptor concentration of $8 \times 10^{17}$ cm$^{-3}$. The n-side electrode 156 has a diameter of 100 µm. The annular exposed surface of the n-type cladding layer 153 has an outer diameter of 120 µm. The annular exposed surface of the p-type cladding layer 155 has an outer diameter of 150 µm. The annular exposed surfaces of the cladding layers 153 and 155 and the n-side electrode 156 are concentric to one another. The LED of this particular structure is generally a square chip, having sides 250 µm long.

An LED of the type shown in FIGS. 10 and 11 was manufactured. It was driven with an operating current of 20 mA for experimental purpose. The LED emitted light, with an external quantum efficiency of 15% at emission wavelength of 400 nm. Then, the LED was resin-molded and further tested. It emitted light of luminous intensity as high as 1 cd. Thus, this LED was proved to have a high luminous efficiency.

Furthermore, LEDs of the type shown in FIGS. 10 and 11 were produced, whose active layers differed in InGaN composition and thickness and contained an impurity forming an emission recombination center. These LEDs were also driven with an operating current of 20 mA. They emitted very luminous light at emission wavelengths ranging from 375 nm to 650 nm.

Still further, an GaAlN layer may be formed in that surface of either the n-type cladding layer 153 or the p-type cladding layer 155 which contacts the active layer 154. If this is the case, the reactive current generated by an overflow of carriers is reduced, whereby the LED has a higher luminous efficiency for short-wavelength light.

The high luminous efficiency of the fifth embodiment made of InGaAlN-based material can be attributed to three advantages features. First, the voltage drop at the p-type ohmic contact is substantially decreased. Second, neither electrode shields the light generated. Third, uniform current injection can be accomplished.

As shown in FIG. 11, the p-side electrode 157 has a slit, which serves as an alignment mark. Due to this slit, the p-side electrode 157 is shaped in the form of letter C, not forming a complete ring. Despite this, the advantages of the invention are not impaired since the p-side electrode 157 surrounds almost all of the circumference of the n-side electrode 156. This means that the fifth embodiment has a surface-surrounded structure, as well, which brings forth the advantages of the present invention. Further, the active layer 154 and the p-type cladding layer 155 may have slits (i.e., alignment marks) similar to the slit made in the p-side electrode 157, in which case, too, the advantages of the invention can be attained.

The present invention can be applied not only to LEDs of the types described above, but also to other semiconductor devices such as semiconductor lasers, in order to enhance the characteristics of the devices.

Sixth Embodiment

FIG. 12 is a perspective view of a semiconductor laser of surface emitting type, which is the sixth embodiment of the present invention. FIGS. 13A and 13B are a plan view and sectional view of the laser, respectively.

As shown in FIGS. 12, 13A and 13B, the surface emitting semiconductor laser comprises a GaAs substrate 161, a ZnMgSeS/ZnSeS Bragg reflection layer 162 formed on the substrate 161, an n-type ZnMgSeS cladding layer 163 provided on the Bragg reflection layer 162, an active layer 164 provided on the n-type cladding layer 163 and having a CdZnSe/ZnSeS quantum well, and a p-type ZnMgSeS cladding layer 165 mounted on the active layer 164. As can be understood from FIGS. 12 and 13A, the active layer 164 and the p-type cladding layer 165 have concentric circular openings, exposing the central part of the n-type cladding layer 163. The n-type cladding layer 163 therefore has a circular exposed surface.

The semiconductor laser further comprises an n-side Ti/Zn electrode 166 and a p-side Pt/Ti/Pt/Au electrode 167. The n-side electrode 166 is a disc formed on the circular exposed surface of the n-type cladding layer 163 and located concentric thereto. As a result, the n-type cladding layer 163 has an annular exposed surface. The p-side electrode 167 is provided on the p-side cladding layer 165. It has a circular opening concentric to the n-side electrode 166, as is best shown in FIG. 13A. An $SiO_2/TiO_2$ Bragg reflection layer 168 is formed, partly on the p-type cladding layer 165 and partly on the p-side electrode 167. The Bragg reflection layer 168 has a circular opening which has the same diameter as, and which is concentric to, the openings of the active layer 164 and the p-type cladding layer 165.

In the structure of FIGS. 12 and 13A and 13B, a current is uniformly injected into the unit comprised of the cladding layers 163 and 165 and the active layer 164 and sandwiched between the two Bragg reflection layers 162 and 168. The laser has a high optical gain and can easily effect laser oscillation through induced emission.

The laser oscillation mode has a ring-shaped near-field pattern. It is therefore easy to reduce the diameter of the laser beam. A laser according to the sixth embodiment was produced which had a laser-oscillation section having a diameter of about 15 µm. This laser proved to have an oscillation threshold current of 5 mA and emitted a beam having a wavelength as short as 495 nm. In view of the beam-focusing characteristic and the emission of a short-wave laser beam, the semiconductor laser of the sixth embodiment makes an optimal light source for use in recording data onto and reading data from a high-density optical disk.

In the sixth embodiment, the $SiO_2/TiO_2$ Bragg reflection layer 168 may be replaced by either a dielectric multilayered film or a semiconductor multilayered film. In the case where a semiconductor multilayered film is used instead of the Bragg reflection layer 168, the laser also has good characteristics, provided that a part of the p-side electrode 167 surrounds this semiconductor multilayered film.

The sixth embodiment is a surface emitting laser made of a CdZnMgSeS-based semiconductor material. The material for the laser is not limited to this. Rather, the surface emitting laser may be made of another semiconductor material such as InGaAs/GaAs/GaAlAs-based material, InGaAlP/GaAlAs-based material, InGaN/GaN/AlGaN-based material or the like.

Seventh Embodiment

Figure 15:
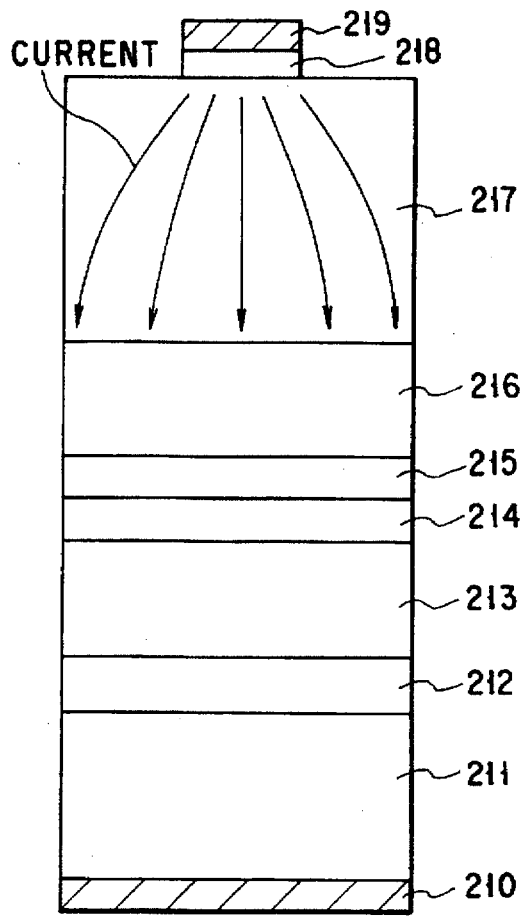
FIG. 15 is a schematic sectional view of a light-emitting diode according to a seventh embodiment of the present invention.

FIG. 15 is a schematic sectional view showing an LED which is the seventh embodiment of the invention. The LED will be described below, as to the materials, thicknesses and doping carrier concentrations of its components.

As FIG. 15 shows, this LED comprises a p-type GaAs substrate 211, a p-type ZnSe buffer layer 212, a p-type $ZnS_{0.05}Se_{0.95}$ second cladding layer 213, a p-type $ZnS_{0.9}Mg_{0.1}S_{0.2}Se_{0.8}$ first cladding layer 214, a multi-layered quantum-well active layer 215, an n-type $ZnS_{0.05}Se_{0.95}$ cladding layer 216, an n-type ZnSe current-diffusing layer 217, and an n+-type ZnSe contact layer 218, which are provided on upon another in the order mentioned. The buffer layer 212 has a thickness of 0.1 µm and a carrier concentration of $1 \times 10^{18}$ cm$^{-3}$. The p-type second cladding layer 213 has a thickness of 1.8 µm and a carrier concentration of $1 \times 10^{18}$ cm$^{-3}$. The p-type first cladding layer 214 has a thickness of 0.2 µm and a carrier concentration of $5 \times 10^{17}$ cm$^{-3}$. The quantum-well active layer 215 is comprised of six undoped $Cd_{0.25}Zn_{0.75}Se$ layers (10 nm thick) and five undoped $ZnS_{0.05}Se_{0.95}$ layers (7.5 nm thick) which are alternately formed on upon another. The n-type cladding layer 216 has a thickness of 2 µm and a carrier concentration of $1 \times 10^{18}$ cm$^{-3}$. The n-type current-diffusing layer 217 has a thickness of 15 µm and a carrier concentration of $5 \times 10^{18}$ cm$^{-3}$. The n+-type contact layer 218 has a thickness of 0.1 µm and a carrier concentration of $1 \times 10^{19}$ cm$^{-3}$.

This multilayered structure may be manufactured by means of MBE (Molecular Beam Epitaxy), using N and Cl, for example, as p-type dopant and n-type dopant, respectively. The LED further comprises a disc-shaped In electrode 219 and an AuZn/Au electrode 210. The In electrode 219 is formed on the $n^+$-type contact layer 218 and has a diameter of 50 μm. The AuZn/Au electrode 219 is provided on the lower surface of the p-type GaAs substrate 211. This LED is generally a square chip, having a size of 400×400 μm.

An LED of the type shown in FIG. 15 was produced for experimental use. When a current of 20 mA was injected into the n-type current-diffusing layer 217 as illustrated in FIG. 15, the LED emitted light of a very high luminous intensity of 1 cd. The light is 50 times or more brighter than the light the conventional LED shown in FIG. 47 can emit. As shown in FIG. 47, the conventional LED comprises a p-side electrode 261, a p-type GaAs substrate 262, a p-type ZnSSe cladding layer 263 (2 μm thick), a CdZnSeSe/ZnSSe multilayered quantum-well active layer 264, an n-type ZnSSe cladding layer 265 (2 μm thick), an $n^+$-type ZnSe contact layer, and an n-side electrode 267, which are provided one upon another in the order mentioned.

In the conventional LED of FIG. 47, a current flows through only that part of the n-type cladding 10 layer 265 which is located right below the n-side electrode 267. Consequently, the light generated in the active layer 264 is shielded by the n-side electrode 267 and cannot be efficiently emitted from the LED. In the LED of this embodiment, the current is diffused thoroughly in the n-type current-diffusing layer 217 as illustrated in FIG. 15. The light generated from the current is emitted from the entire light-emitting surface. The LED thereby emits light of high luminous intensity. Since the n-type current-diffusing layer 217 has greater band-gap energy than the quantum-well active layer 215, the light generated in the active layer 215 can emitted without any absorption loss.

The n-type ZnSSe cladding layer 265 of the conventional LED (FIG. 47) may be formed thick by MBE method in order to improve the operating efficiency. However, an n-type ZnSSe cladding layer can hardly be formed to a thickness of 4 μm or more, without impairing the composition ratio x of $ZnS_xSe_{1-x}$, for the following reasons.

In MBE method, Zn, Mg, Se, Cd or the like, a compound of any of these metals, such as ZnS or $ZnCl_2$, is heated in a crucible, and the molecules of the material are applied in the form of a beam onto a substrate, thereby to grow crystals on the substrate. To form on a substrate a layer of a ternary compound such as ZnSSe or a layer of a quarternary compound such as ZnMgSSe, the components of the material are heated, in separate crucibles, at different temperatures, thereby controlling the amount of the molecular beam and thus the composition of the layer made grown on the substrate. Here arises a problem.

The amount of the molecular beam greatly varies even if the temperature in each crucible changes a little because the compounds of II- and III-group elements generally have extremely high vapor pressures. This makes it very difficult to control reliably the composition of a ternary or quaternary compound in growing a layer of either compound. In particular, a thick layer of either compound, formed by MBE method, has a composition which much varies in the direction of thickness.

In the case of a II-VI compound semiconductor layer, such a composition variation induces defects or dislocations which causes non-radiative recombination. The defects or dislocations will adversely influence the characteristics of the resultant device, such as lifetime and reliability.

An LED identical to the conventional LED shown in FIG. 47 was manufactured. In the process of producing this LED, an n-type ZnSSe cladding layer (equivalent to the layer 265) was grown to a thickness of 4 μm. Dislocations formed in the n-type ZnSSe cladding layer. The LED thus produced was continuously operated until it stopped performing its function. Its lifetime was extremely short.

By contrast, a ZnSe layer (i.e., a layer made of a binary compound) can grow, while maintaining its stoichiometric composition even if the temperature varies in the crucible containing Zn and the crucible containing Se. A ZnSe layer, if grown considerably thick, contains neither dislocations nor defects and exhibits good crystallinity.

The reason why the LED of the seventh embodiment has high luminous efficiency is that the p-type ZnSMgSSe first cladding layer 214 effectively confines electrons. On the other hand, the conventional LED of FIG. 47 fails to have a sufficiently high luminous efficiency. This is because there is but a small difference in band-gap energy between CdZnSe and ZnSSe forming the active layer 264. As a result, electrons having small mass overflow into the p-type cladding layer 263, reducing the luminous efficiency.

In the seventh embodiment, part of the p-type cladding layer 214 close to the active layer 215 is made of ZnMgSSe. $Zn_{0.9}Mg_{0.1}S_{0.2}Se_{0.8}$ has band-gap energy about 150 meV greater than the band-gap energy of $ZnS_{0.05}Se_{0.95}$. The p-type cladding layer 214 serves to confine the injected electrons in the active layer 215, improving the luminous efficiency. Thus, the LED of the seventh embodiment can reliably operate continuously for a long time, for example 5000 hours or more at temperature of 50° C.

Figure 16:
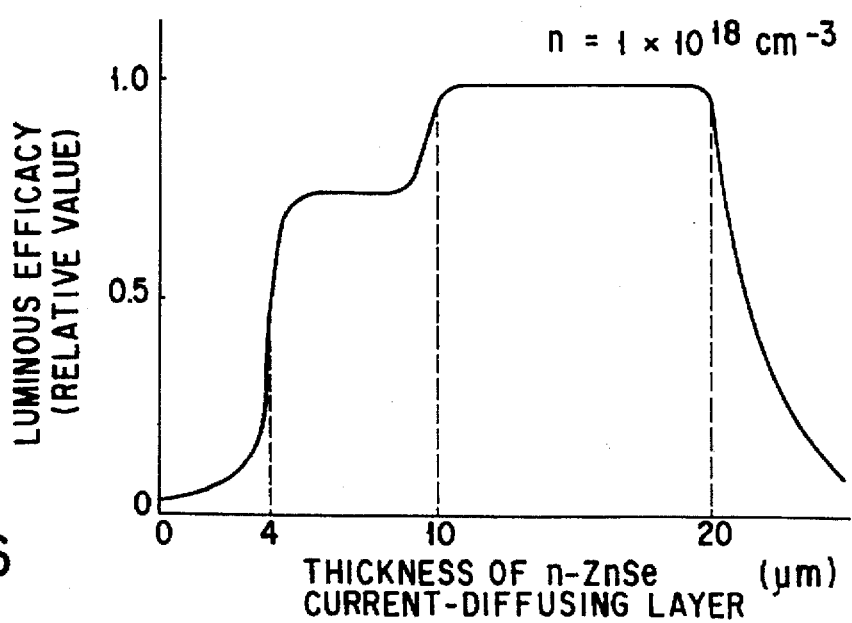
FIG. 16 is a graph representing the relationship between luminous efficiency and the thickness of an n-type ZnSe current-diffusing layer.

FIG. 16 represents the relationship between luminous efficiency and the thickness of the n-type ZnSe current-diffusing layer 217. It is desired that the layer 217 has such a thickness as to diffuse a current as much as possible. As evident from FIG. 16, a current is adequately diffused, increasing the luminous efficiency, if the n-type ZnSe current-diffusing layer 217 is 4 μm or more thick and has a carrier concentration of $1 \times 10^{18}$ $cm^{-3}$. The luminous efficiency further increases if the current-diffusing layer 217 has a thickness of 10 μm or more. The reason is that, as the layer 217 is made to grow for a long time (about 5 to 10 hours) to have a thickness of 10 μm, the double-hetero junction is annealed to have its crystallinity improved.

If the n-type ZnSe current-diffusing layer 217 has a thickness of 20 μm or more, the luminous efficiency will decrease. There are two reasons. First, the degree of current diffusion is saturated. Second, impurities diffuse into the active layer 215 due to the heat applied during the long-time growth of the layer 217.

Figure 17:
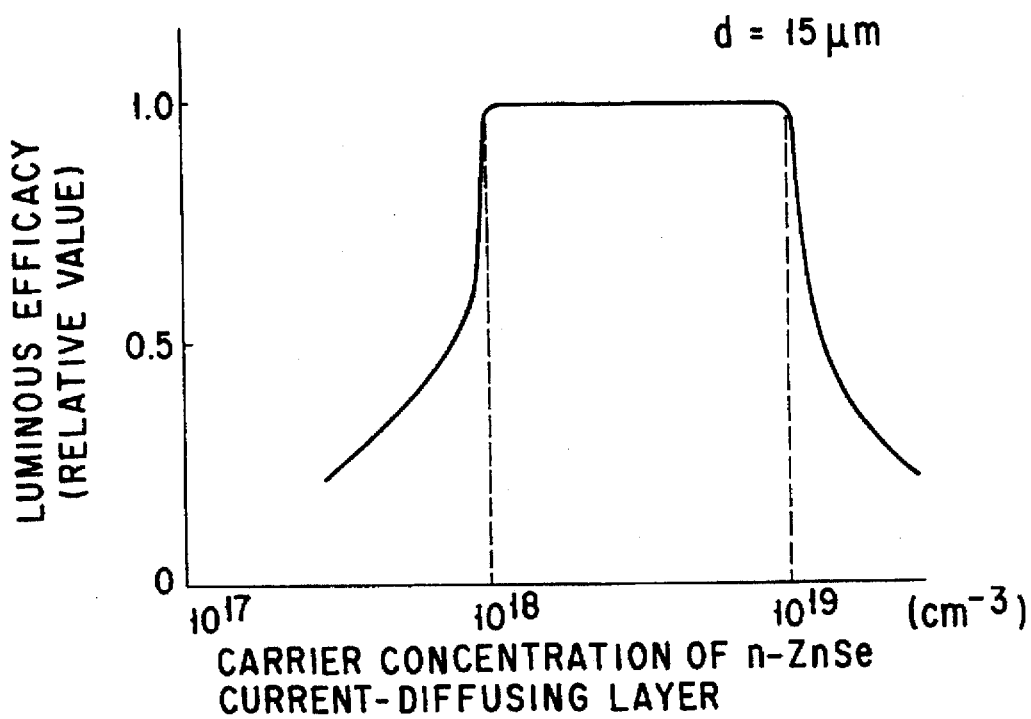
FIG. 17 is a graph illustrating the relationship between luminous efficiency and the carrier concentration in the n-type ZnSe current-diffusing layer.

FIG. 17 illustrates the relationship between the luminous efficiency and the carrier concentration in the n-type ZnSe current-diffusing layer 217 which has a thickness of 15 μm. As can be understood from FIG. 17, if the layer 217 has such a thickness as to diffuse a current than $1 \times 10^{18}$ $cm^{-3}$, it has high resistivity and fails to diffuse the current adequately. As a consequence, the luminous efficiency of the LED is low. If the n-type current-diffusing layer 217 has been so doped to have a carrier concentration of more than $1 \times 10^{19}$ $cm^{-3}$, its surface becomes opaque due to deterioration of crystallinity. The luminous efficiency of the LED therefore decreases. Hence, the LED can exhibit high luminous efficiency if the n-type current-diffusing layer 217 has a carrier concentration ranging from $1 \times 10^{18}$ to $1 \times 10^{19}$ $cm^{-3}$.

Figure 18:
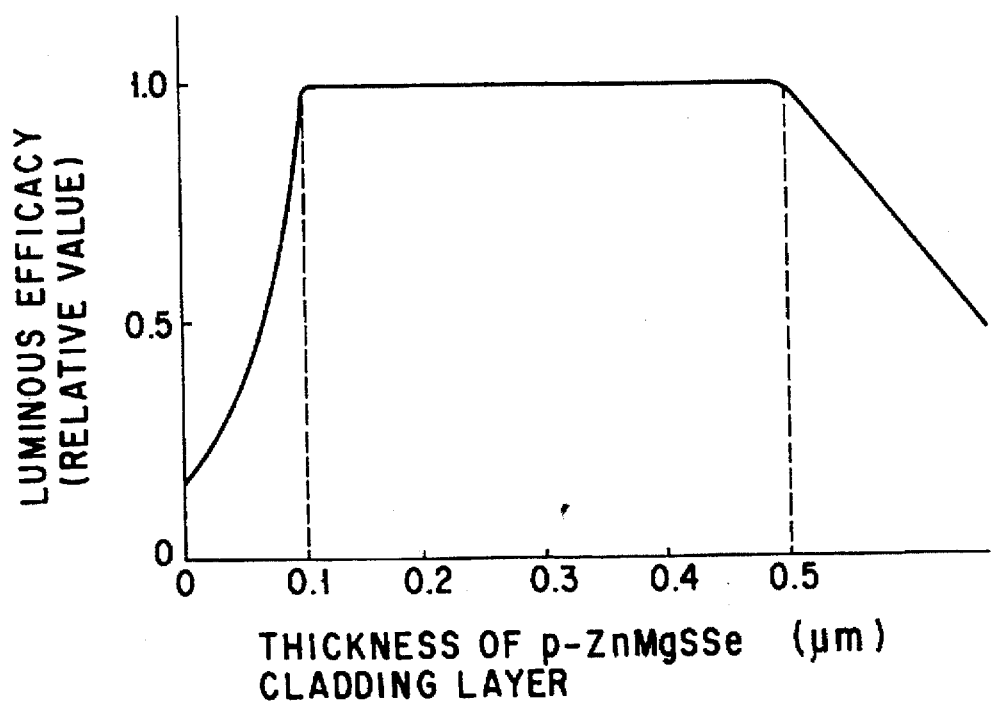
FIG. 18 is a graph indicating the relationship between luminous efficiency and the thickness of a p-type ZnMgSSe first cladding layer.

FIG. 18 indicates the relationship between luminous efficiency and the thickness of the p-type ZnMgSSe first cladding layer 214. As can be seen from FIG. 18, the luminous efficiency of the LED is low if the p-type first cladding layer 214 is less than 0.1 μm thick. This is due to the reactive current generated from the overflow of electrons. The luminous efficiency is sufficiently high if the layer 214 has a thickness ranging from 0.1 μm to 0.5 μm. The luminous efficiency decreases if the layer 214 has a thickness exceeding 0.5 μm. This is because ZnMgSSe undergoes composition changes, and dislocations and defects are inevitably formed in the crystal.

Eighth Embodiment

Figure 19:
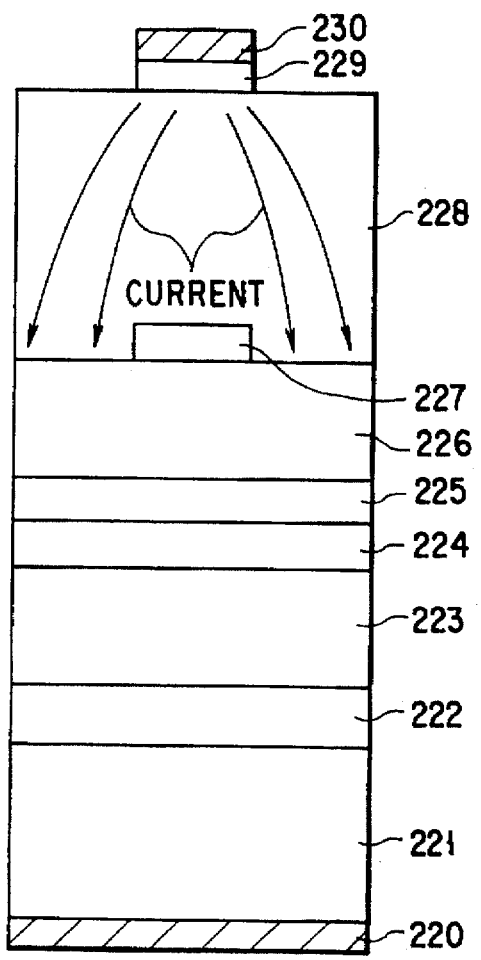
FIG. 19 is a schematic sectional view of a light-emitting diode according to an eighth embodiment of the present invention.

FIG. 19 is a sectional view of an LED according to the eighth embodiment of the present invention.

As FIG. 19 shows, the LED comprises a p-type GaAs substrate 221, a p-type ZnSe buffer layer 222, a p-type ZnSSe second cladding layer 223, a p-type ZnMgSSe first cladding layer 224, a multilayered quantum-well active layer 225, an n-type ZnSSe cladding layer 226, a p-type ZnSe current-blocking layer 227, an n-type ZnSe current-diffusing layer 228, and an n⁺-type ZnSe contact layer 229, which are provided on upon another in the order mentioned. The buffer layer 222 has a thickness of 0.1 μm and a carrier concentration of $1\times10^{18}$ cm$^{-3}$. The p-type second cladding layer 223 has a thickness of 1.8 μm and a carrier concentration of $1\times10^{18}$ cm$^{-3}$. The p-type first cladding layer 224 has a thickness of 0.2 μm and a carrier concentration of $5\times10^{17}$ cm$^{-3}$. The quantum-well active layer 225 is comprised of six undoped CdZnSe layers (10 nm thick) and five undoped ZnSSe layers (7.5 nm thick) which are alternately formed one upon another. The n-type cladding layer 226 has a thickness of 2 μm and a carrier concentration of $1\times10^{18}$ cm$^{-3}$. The p-type current-blocking layer 227 has a thickness of 0.2 μm and a carrier concentration of $1\times10^{18}$ cm$^{-3}$. The n-type current-diffusing layer 228 has a thickness of 15 μm and a carrier concentration of $5\times10^{18}$ cm$^{-3}$. The n⁺-type contact layer 229 has a thickness of 0.1 μm and a carrier concentration of $1\times10^{19}$ cm$^{-3}$.

The p-type current-blocking layer 227 is a disc having a diameter of 50 μm. It has been formed by performing selective etching on a p-type ZnSe layer formed on the layer 226 by means of MBE method and having the same size as the layers 222 to 226 which have been formed by MBE method, as well. The n-type current-diffusing layer 228 has been formed by means MBE method, covering the layer 226 and the layer 227. The n⁺-type contact layer 229 is a disc and positioned concentric to the p-type current-blocking layer 227.

The LED further comprises a disc-shaped In electrode 230 and an AuZn/Au electrode 220. The electrode 230 is formed on the n⁺-type contact layer 229 and has a diameter of 50 μm. The AuZn/Au electrode 220 is provided on the lower surface of the p-type GaAs substrate 221.

The p-type current-blocking layer 227 prevents a current from flowing into that part of the n-type current-diffusing layer 228 which is located right below the In electrode 230 which shields the light generated by the LED. Thus, the layer 227 guides the current in the other part of the n-type current-diffusing layer 228. It is sufficient to arrange the current-blocking layer 227 between the active layer 225 and the In electrode 230. To minimize the current flowing into that portion of the n-type cladding layer 226 which is below the current-blocking layer 227, however, it is desired that the layer 227 be located as near the possible to the active layer 225.

The current-blocking layer 227 may be formed of, for example, high-resistivity semiconductor, insulating material or semiconductor having the conductivity type opposite to that of the n-type cladding layer 226. Alternatively, the layer 227 can be made of material transparent to the light generated by the active layer 225, whereby the light can be emitted more effectively than otherwise. This is because the current-blocking layer 227 scarcely absorbs the light generated from the current flowing into that part of the n-type cladding layer 226 which is positioned right below the current-blocking layer 227.

An LED of the eighth embodiment was produced. Then an operating current of 20 mA was injected into this LED as is shown in FIG. 19, the LED emitted light having a wavelength of 520 nm and a very high luminous intensity of 1.5 cd. The light is 50% brighter than the light the LED of the seventh embodiment (FIG. 15) can emit. The reason is that emission of light is suppressed in that part of the n-type current-diffusing layer 228 which is located right below the In electrode 230 which shields the light. The current therefore diffuses through the other part of the current-diffusing layer 228, whereby the light is output with high efficiency.

As described above, the seventh and eighth embodiments have a p-type GaAs substrate 221. The substrate 221 may be replaced by an n-type GaAs substrate, and the current-diffusing layer 228 may be made of p-type ZnSe, not n-type ZnSe. In this case, the LED can attain the same advantages.

Ninth Embodiment

Figure 20:
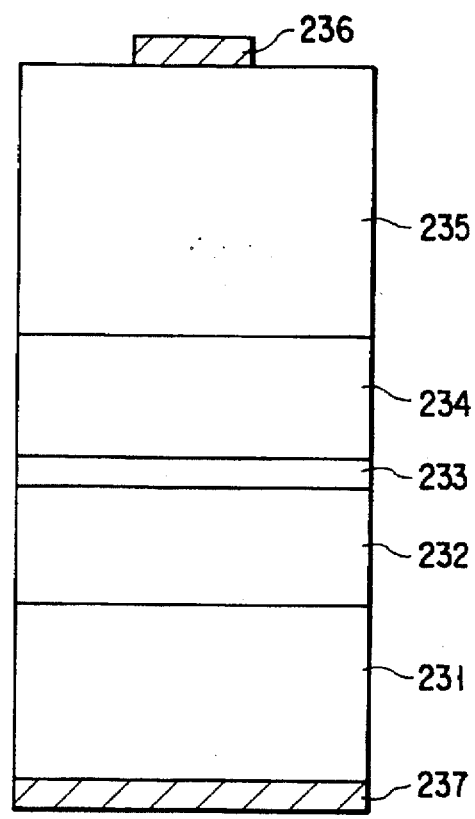
FIG. 20 is a schematic sectional view of a light-emitting diode according to a ninth embodiment of the invention.

FIG. 20 is a sectional view of an LED according to the ninth embodiment of the invention.

As illustrated in FIG. 20, the LED comprises a p-type GaP substrate 231, a p-type ZnMgS cladding layer 232 formed on the substrate 231, a ZnSSe active layer 233 provided on the p-type cladding layer 232, an n-type ZnMgS cladding layer 234 provided on the active layer 233, an n-type ZnS current-diffusing layer 235 formed on the n-type cladding layer 234. The p-type cladding layer 232 has a thickness of 2 μm and a carrier concentration of $1\times10^{18}$ cm$^{-3}$. The active layer 233 is 20 nm thick. The n-type cladding layer 234 has a thickness of 2 μm and a carrier concentration of $1\times10^{18}$ cm$^{-3}$. The current-diffusing layer 235 has a thickness of 15 μm and a carrier concentration of $5\times10^{18}$ cm$^{-3}$.

The LED further comprises an In electrode 236 and an AuZn/Au electrode 237. The In electrode 236 is a disc formed on the n-type ZnS current-diffusing layer 235 and having a diameter of 50 μm. The AuZn/Au electrode 237 is provided on the lower surface of the p-type GaP substrate 231. The LED having this specific structure is generally a square chip, having a size of 400×400 μm.

An LED having the structure of FIG. 20 was made for experimental use. When driven with an operating current of 20 mA, the LED emitted light, with an external quantum efficiency of 10% at emission wavelength of 350 nm. The LED proved to have very high luminous efficiency. This is because the current injected sufficiently diffused in the n-type ZnS current-diffusing layer 235.

Tenth Embodiment

Figure 21:
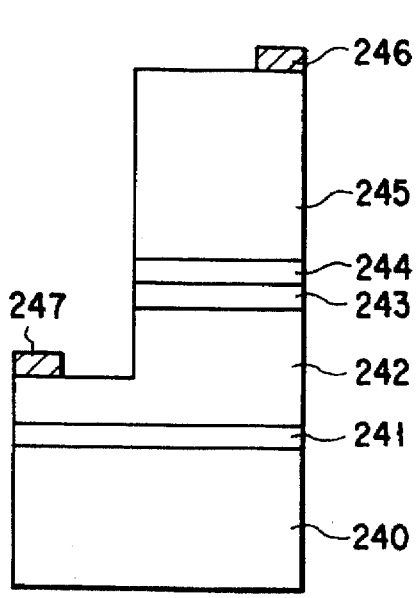
FIG. 21 is a schematic sectional view of a light-emitting diode according to a tenth embodiment of the invention.

FIG. 21 is a sectional view of an LED according to the tenth embodiment of the present invention.

As FIG. 21 shows, the LED comprises a sapphire substrate 240, a GaN buffer layer 241 provided on the substrate 240, an n-type GaN cladding layer 242 formed on the buffer layer 241, an InGaN active layer 243 mounted on the n-type cladding layer 242, a p-type GaAlN cladding layer 244 formed on the active layer 243, and a p-type GaN cladding layer 245 provided on the GaAlN cladding layer 244. The buffer layer 241 is 20 nm thick. The n-type GaN cladding layer 242 has a thickness of 5 μm and a carrier concentration of $4\times10^{17}$ cm$^{-3}$. The InGaN active layer 243 is 20 nm thick. The p-type GaAlN cladding layer 244 is 0.2 μm thick and has a carrier concentration of $5\times10^{17}$ cm$^{-3}$. The p-type GaN cladding layer 245 has a thickness of 10 μm and a carrier concentration of $1\times10^{18}$ cm$^{-3}$.

The n-type GaN cladding layer 242 has a stepped portion. It therefore has two top surfaces at two different levels, namely a higher top surface and a lower top surface. It is on the higher top surface that the active layer 243 is provided.

The LED further comprises a p-side Pt/Ti/Pt/Au electrode 246 and an n-side Al electrode 247. The p-side electrode 246 is mounted on the GaN cladding layer 245. The n-side electrode 247 is provided on the lower top surface of the n-type GaN cladding layer 242. The tenth embodiment is characterized in that the p-type GaN cladding layer 245 functions not only as a second p-type cladding layer, but also as a current-diffusing layer.

An LED of the type shown in FIG. 21 was produced for experimental use. When driven with an operating current of 20 mA, the LED emitted light, with an external quantum efficiency of 15% at emission wavelength of 400 nm. The LED was found to possess very high luminous efficiency. This high luminous efficiency is attributable to two facts. First, the p-type cladding layer 244 contacting the active layer 243 is made of GaAlN which has a large band-gap energy and hence suppresses an overflow of electrons. Second, the p-type GaN cladding layer 245 (functioning as a current-diffusing layer, as well) is thick enough to diffuse the injected current adequately.

The double-hetero junction of this embodiment is made of III-V compound semiconductors such as GaN and GaAlN, whereas the double-hetero junction is formed of II-VI compound semiconductors in the seventh to ninth embodiments. Notwithstanding, the tenth embodiment can achieve the same advantages as the seventh to ninth embodiments. In the present embodiment, the sapphire substrate 240 may be replaced by a Si substrate.

Eleventh Embodiment

Figure 22:
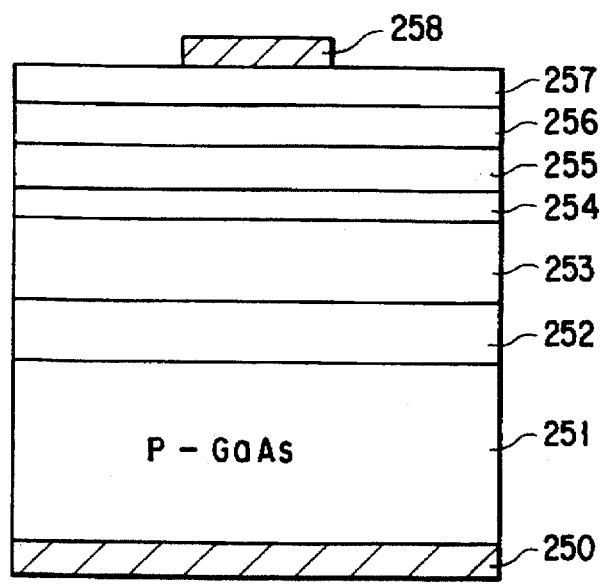
FIG. 22 is a schematic sectional view of a light-emitting diode according to an eleventh embodiment of this invention.

FIG. 22 is a sectional view of an LED according to the eleventh embodiment of this invention.

As shown in FIG. 22, the LED comprises a p-type GaAs substrate 251, a buffer layer 252 provided on the substrate 251, a p-type cladding layer 253 formed on the buffer layer 252, an active layer 254 formed on the p-type cladding layer 253, and an n-type cladding layer 255 provided on the active layer 254. The p-type cladding layer 253, the active layer 254 and the n-type cladding layer 255 constitute a double-hetero junction.

The LED further comprises an n-type ZnSe layer 256 formed on the n-type cladding layer 255, an ITO layer 257 provided on the ZnSe layer 256, an n-side electrode 258 mounted on the ITo layer 257, and a p-side electrode 250 provided on the lower surface of the p-type GaAs substrate 251. The ITO layer 257 characterizes this embodiment. Made of ITO, a transparent material, the layer 257 can be as thin as about 0.1 to 1 μm.

The seventh to tenth embodiments, described above, are identical in basic structure, which comprises: a double-hetero junction provided on a semiconductor substrate and formed of an active layer of II-VI compound semiconductor and two cladding layers sandwiching the active layer; a first electrode provided on a part of the double-hetero junction; a second electrode formed on that surface of the semiconductor substrate which faces away from the double-hetero junction (in the tenth embodiment, on the same surface of the substrate as the double-hetero junction); a current-diffusing layer interposed between the double-hetero junction and the first electrode and having band-gap energy greater than the active layer, a thickness of 4 to 20 μm and a carrier concentration is about $1\times10^{18}$ cm$^{-3}$.

It is preferred that the current-diffusing layer be made of a binary compound such as ZnSe, ZnS or GaN. Of the cladding layers forming the double-hetero junction, the p-type one is desirably comprised of at least two layers, the first of which contacts the active layer and the second of which is spaced apart therefrom. Further it is desired that the first of said at least two layers have a greater band-gap energy than the second and have a thickness falling within the range of 0.1 to 0.5 μm.

Twelfth Embodiment

Figure 23:
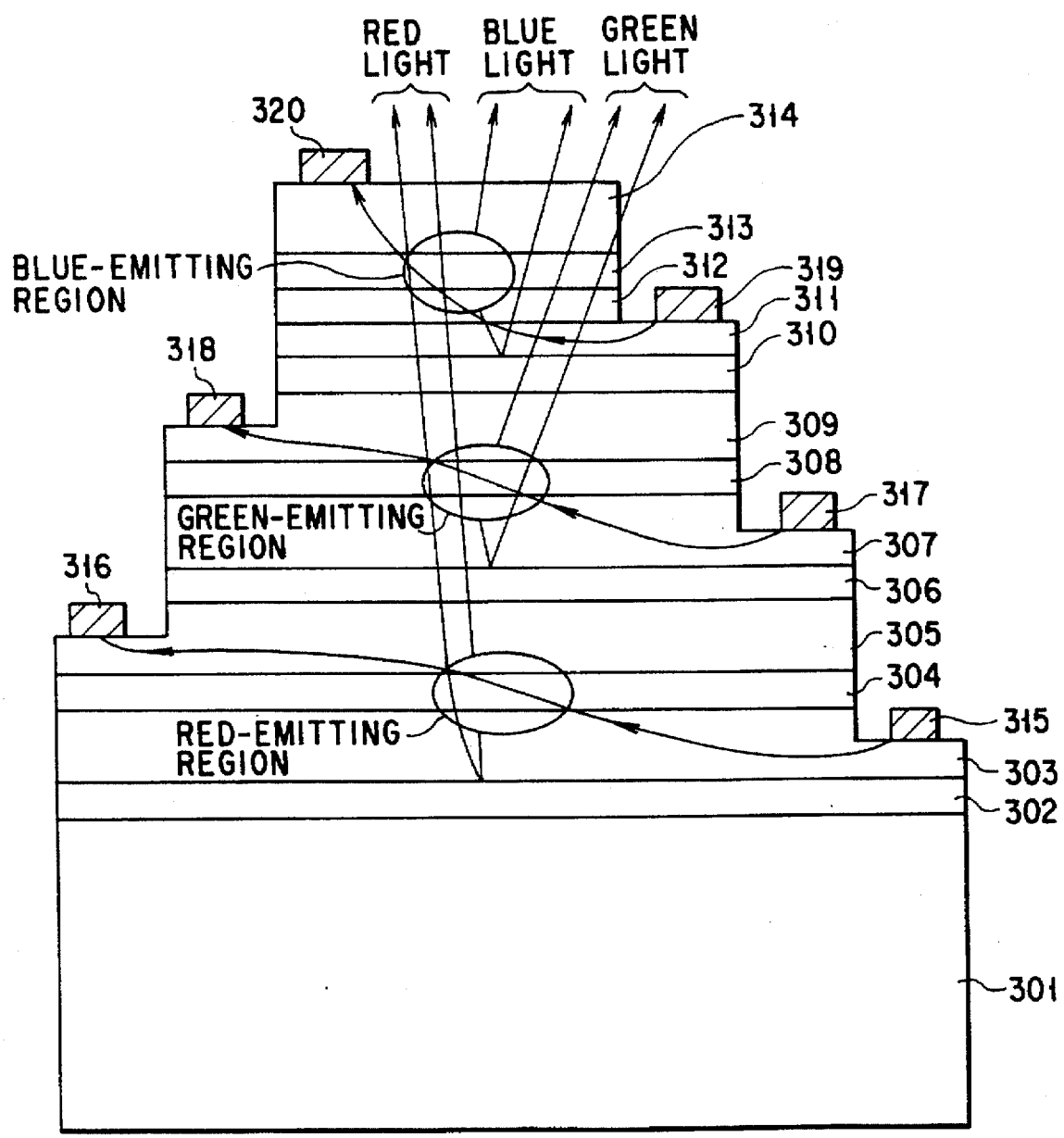
FIG. 23 is a schematic sectional view of a primary color emitting device according to a twelfth embodiment of the present invention.

FIG. 23 is a sectional view of a primary color emitting device which is the twelfth embodiment of the present invention.

As shown in FIG. 23, the device comprises an n-type GaAs substrate 301, a DBR red-reflecting mirror 302 provided on the substrate 301, a p-type InGaAlP first cladding layer 303 formed on the red-reflecting mirror 302, an InGaP red-light active layer 304 formed on the first cladding layer 303, an n-type InGaAlP second cladding layer 305 mounted on the active layer 304, a DBR green-reflecting mirror 306 provided on the second cladding layer 305, and a p-type InGaAlP third cladding layer 307 formed on the green-reflecting mirror 306. The primary color emitting device further comprises an InGaAlP green-light active layer 308 formed on the third cladding layer 307, an n-type InGaAlP fourth cladding layer 309 provided on the green-light active layer 308, a DBR blue-reflecting mirror 310 mounted on the fourth cladding layer 309, a p-type InGaP contact layer 311 formed on the blue-reflecting mirror 310, a p-type ZnSSe fifth cladding layer 312 provided on the contact layer 311, a ZnSe blue-light active layer 313 formed on the fifth cladding layer 312, and an n-type ZnSSe sixth cladding layer 314 provided on the blue-light active layer 313.

The red-reflecting mirror 302 is a two-layered member comprised of an n-type GaAs layer and an n-type InGaP layer. Similarly, the green-reflecting mirror 306 is a two-layered member comprised of an n-type GaAs layer and an n-type InGaP layer. The blue-reflecting mirror 310 is also a two-layered member comprised of an n-type GaAs layer and an n-type InGaP layer.

The first cladding layer 303, the second cladding layer 305, the third cladding layer 307 and the fourth cladding layer 309 have a stepped portion each, and hence, an exposed surface each. The contact layer 311 has an exposed surface, too. Being the uppermost layer, the sixth cladding layer 314 has of course an exposed surface.

Still further does the primary color emitting device comprise: a p-side AuZn electrode 315 and an n-side AuGe electrode 316, both provided for a red-emitting unit; a p-side AuZn electrode 317 and an n-side AuGe electrode 318, both provided for a green-emitting unit; and a p-side AuZn electrode 319 and an n-side AuGe electrode 320, both provided for a blue-emitting unit. The electrode 315 is mounted on the exposed surface of the first cladding layer 303, the electrode 316 on the exposed surface of the second cladding layer 305, the electrode 317 on the exposed surface of the third cladding layer 307, the electrode 318 on the exposed surface of the fourth cladding layer 309, the electrode 319 on the exposed surface of the contact layer 311, and the electrode 320 on the sixth cladding layer 314.

When a current is supplied between the p-side electrode 315 and the n-side electrode 316, the device emits red light. When a current is supplied between the p-side electrode 317 and the n-side electrode 318, the device emits green light. Likewise, when a current is supplied between the p-side electrode 319 and the n-side electrode 320, the device emits blue light.

Figure 24:
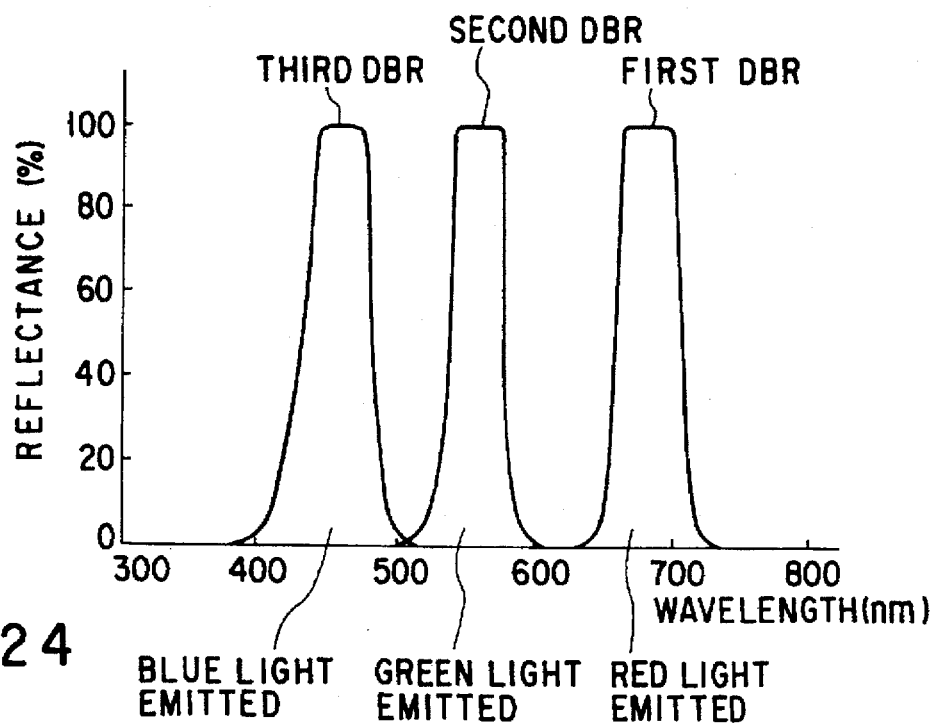
FIG. 24 is a diagram illustrating the spectral characteristic of the device shown in FIG. 23.

FIG. 24 is a diagram illustrating the spectral characteristics of the first, second and third DBR mirrors 302, 306 and 310. The first DBR mirror 302 reflects red light. The second DBR mirror 306 allows passage of red light and reflects green light. The third DBR mirror 310 allows passage of red light and green light and reflects blue light. The particular spectral characteristic of each DBR mirror depends upon the thickness n-type GaAs layer and that of the n-type InGaP layer, which constitute the DBR mirror.

As can be seen from FIG. 23, red light passes through the third cladding layer 303, the layers 304 to 313 and the sixth cladding layer 314, since the layers 303 and the layers 305 to 314 have band-gap energy greater than the InGaP red-light active layer 304. The green light passes through the third cladding layer 307, the sixth cladding layer 314 and the intervening layers 308 to 313, because the layers 307 and the layers 309 to 313 have band-gap energy greater than the green-light active layer 308. The blue light passes through the fifth cladding layer 312, the blue-light active layer 313 and the sixth cladding layer 314, since the layers 312 and 314 have band-gap energy greater than the blue-light active layer 313.

The DBR mirrors 302, 306 and 310 reflect red light, green light and blue light, respectively. Therefore, the active layer 304 is prevented from being excited by green light or blue light, and the active layer 308 from being excited by green light.

As may be understood from the above, the primary color emitting device according to the twelfth embodiment has three light-emitting elements arranged one upon another and designed to emit red, green and blue light beams, respectively. Small and thin, these elements are combined in a high integration density.

Thirteenth Embodiment

Figure 25:
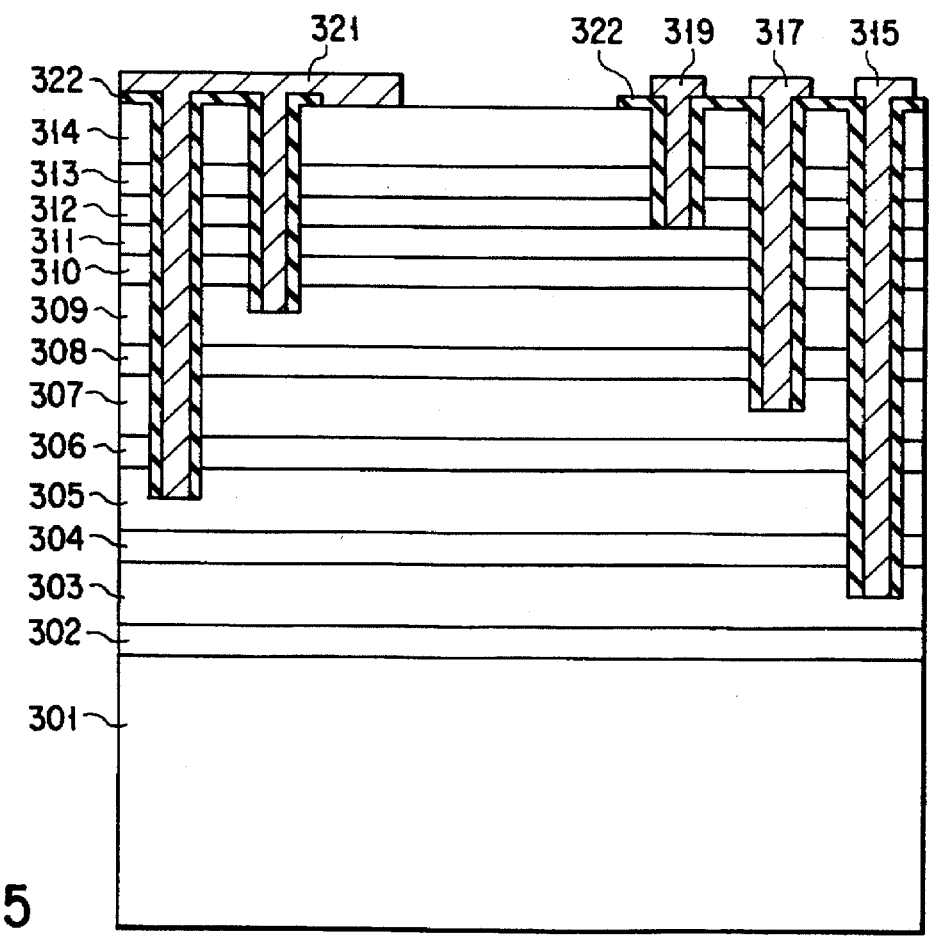
FIG. 25 is a schematic sectional view of a primary color emitting device according to a thirteenth embodiment of the present invention.

FIG. 25 is a sectional view of a primary color emitting device according to the thirteenth embodiment of the present invention. The components identical or similar to those shown in FIG. 23 are designated at the same numerals in FIG. 25 and will not be described in detail. The thirteen embodiment is, as it were, a planar version of the primary color emitting device according to the eleventh embodiment (FIG. 22).

As illustrated in FIG. 25, a first groove is made in the layers 305 to 314, vertically extending through the layers 306 to 314. A second groove is made in the layers 309 to 314, vertically extending through the layers 310 to 314. An insulating film 322 is formed on that part of the uppermost layer 314 in which the grooves open, and on the vertical surfaces of the first and second grooves. An n-side AuGe electrode 321, which is common to the red-, green- blue-emitting units, is formed on said part of the layer 314 and fills the first and second grooves, contacting the n-type InGaAlP second cladding layer 305 in the first groove, the n-type InGaAlP fourth cladding layer 309 in the second groove, and the n-type ZnSSe sixth cladding layer 314 at the surface of the layer 314.

Further, a third groove is made in the layers 303 to 314, vertically extending through the layers 304 to 314. A fourth groove is formed in the layers 307 to 314, vertically extending through the layers 308 to 314. A fifth groove is made in the layers 312 to 314, extending through these layers. An insulating film 322 is formed on that part of the uppermost layer 314 in which the third to fifth grooves open, and on the vertical surfaces of these grooves. A p-side AuZn electrode 315 for the red-emitting unit is formed in the third groove, contacting the n-type InGaAlP first cladding layer 303. A p-side AuZn electrode 317 for the green-emitting unit is formed in the fourth groove, contacting the p-type InGaAlP third cladding layer 307. A p-side AuZn electrode 319 for the blue-emitting unit is formed in the fifth groove, contacting the p-type InGaP contact layer 311.

This device of planar type, shown in FIG. 25, attains the same advantages as the primary color emitting device according to the eleventh embodiment (FIG. 22).

FIG. 26 is a plan view of an apparatus which comprises four primitive color emission devices of the type shown in FIG. 25. Since each device can emits red, green and blue light beams, the apparatus may be used as a handy color-display panel.

Fourteenth Embodiment

FIG. 27 is a sectional view of a primary color emitting device according to the fourteenth embodiment of the invention. This device is characterized in that the blue-emitting unit has a component made of InGaN.

This primary color emitting device has a GaAs substrate 331 which has a light-outputting window. It comprises a buffer layer 332, an n-type GaN sixth cladding layer 333, an n-type InGaN blue-light active layer 334, a p-type GaN fifth cladding layer 335, a DBR blue-reflecting mirror 336, an n-type InGaAlP fourth cladding layer 337, an InGaAlP green-light active layer 338, a p-type InGaAlP third cladding layer 339, a DBR green-reflecting mirror 340, an n-type InGaAlP second cladding layer 341, an InGaP red-light active layer 342, a p-type InGaAlP first cladding layer 343, a DBR red-reflecting mirror 344, and a p-type InGaP contact layer 345, which are arranged on the lower surface of the substrate 331, one upon another in the order mentioned.

The buffer layer 332 is made of GaN or InN. The DBR blue-reflecting mirror 336 is a two-layered member comprised of an n-type GaAs layer and an n-type InGaP layer. The DBR green-reflecting mirror 340 is also a two-layered member consisting of an n-type GaAs layer and an n-type InGaP layer. The DBR red-reflecting mirror 344 is a two-layered member formed of an n-type GaAs layer and an n-type InGaP layer.

As FIG. 27 shows, a first groove is made in the layers 333 to 345, vertically extending through the layers 334 to 345. Further, a second groove is formed in the layers 337 to 345, vertically extending through the layers 338 to 345. A third groove is formed in the layers 341 to 345, also vertically extending through the layers 342 to 345. A fourth groove is made in the layers 343 to 345, vertically extending through the layers 343 and 344. A fifth groove is formed in the layers 339 to 345, vertically extending through the layers 340 to 345. A sixth groove is made in the layers 335 to 345, extending through 336 to 345.

An insulating film 346 is formed on the lower surface of the lowermost layer 345, at which the five grooves open, and also on the vertical surfaces of these grooves. An n-side AuGe electrode 347, which is common to red-, green- blue-emitting units, is formed on that part of the layer 345 at which the first to third grooves open and fills the first to third grooves, contacting the n-type InGaAlP sixth cladding layer 333 in the first groove, the n-type InGaAlP fourth cladding layer 337 in the second groove, and the n-type InGaAlP second cladding layer 341 in the third groove.

A p-side AuZn electrode 348 for the red-emitting unit is formed in the fourth groove, contacting the n-type InGaAlP first cladding layer 343. A p-side AuZn electrode 349 for the green-emitting unit is formed in the fifth groove, contacting the p-type InGaAlP third cladding layer 339. A p-side AuZn electrode 350 for the blue-emitting unit is formed in the sixth groove, contacting the p-type GaN fifth cladding layer 335.

The device of the fourteenth embodiment, shown in FIG. 27, attains the same advantages as the primary color emitting device according to the twelfth embodiment (FIG. 25).

Fifteenth Embodiment

FIG. 28 is a sectional view of a primary color emitting device according to the fifteenth embodiment of the invention. This device is made of InGaAlN-based materials only.

As shown in FIG. 28, the device has a GaAs substrate 361. It comprises a DBR red-reflecting mirror 362, an n-type GaN first cladding layer 363, an InN red-light active layer 364, a p-type GaN second cladding layer 365, a DBR green-reflecting mirror 366, an n-type GaN third cladding layer 367, an InGaN green-light active layer 368, a p-type GaN fourth cladding layer 369, a DBR flue-reflecting mirror 370, an n-type GaN fifth cladding layer 371, an InGaN blue-light active layer 372, and a p-type GaN sixth cladding layer 373, which are arranged on the substrate 361, one upon another in the order mentioned.

The DBR red-reflecting mirror 362 is a two-layered member formed of an n-type InN layer and an n-type GaN layer. The DBR green-reflecting mirror 366 is also a two-layered member consisting of an n-type InN layer and an n-type GaN layer. The DBR blue-reflecting mirror 370 is a two-layered member comprised of an n-type InN layer and an n-type GaN layer.

The first cladding layer 363, the second cladding layer 365, the third cladding layer 367, the fourth cladding layer 369 and the fifth cladding layer 371 have a stepped portion each, and hence, an exposed surface each. Being the uppermost layer, the sixth cladding layer 373 has of course an exposed surface.

Still further does the primary color emitting device comprise: a n-side AuZn electrode 374 and p-side AuGe electrode 375, both for a red-emitting unit; an n-side AuZn electrode 376 and a p-side AuGe electrode 377, both provided for a green-emitting unit; and an n-side AuZn electrode 378 and a p-side AuGe electrode 379, both provided for a blue-emitting unit. The electrode 374 is mounted on the exposed surface of the first cladding layer 363, the electrode 375 on the exposed surface of the second cladding layer 365, the electrode 376 on the exposed surface of the third cladding layer 367, the electrode 377 on the exposed surface of the fourth cladding layer 369, the electrode 378 on the exposed surface of the fifth cladding layer 71, and the electrode 379 on the sixth cladding layer 73.

The device of the fifteenth embodiment achieves the same advantages as the twelfth embodiment. An apparatus having a plurality of devices identical to this embodiment may be manufactured as is illustrated in FIG. 26.

In the fifteenth embodiment, any one of, or any combination of, light-emitting materials other than those used in the eleventh to fourteenth embodiments can be utilized.

Moreover, the material of the substrate 361 is not limited to semiconductor. Rather, the substrate 361 can be made of insulating material or conductive material.

The twelfth to fifteen embodiments of the present invention, described above, may be applied to a device for emitting two color beams and a device for emitting four or more color beams, as well.

Sixteenth Embodiment

Figure 29:
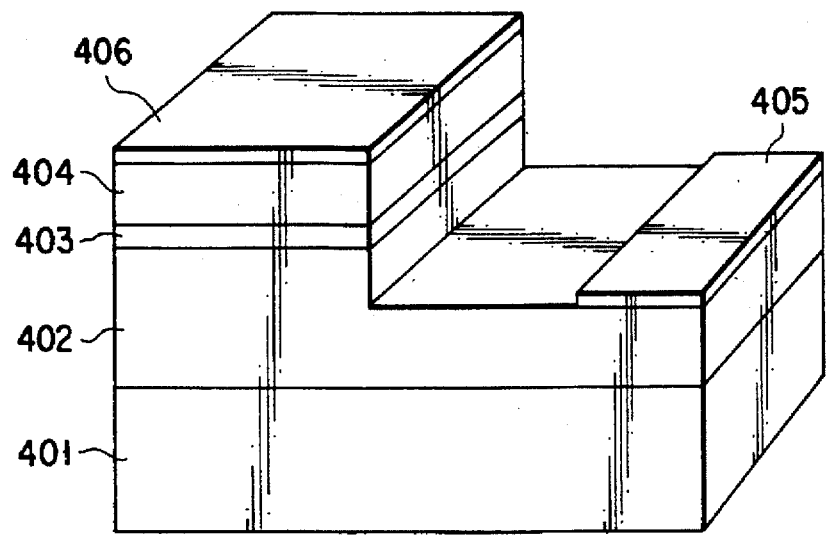
FIG. 29 is a schematic perspective view of a light-emitting diode according to a sixteenth embodiment of the present invention.

FIG. 29 is a perspective view of an LED according to the sixteenth embodiment of the present invention.

As seen in FIG. 29, the LED comprises a ZnSe substrate 401, a p-type ZnSe cladding layer 402 formed on the substrate 401, a ZnCdSe active layer 403 provided on the p-type cladding layer 402, and an n-type ZnSe cladding layer 404 formed in the active layer 403. The substrate 401 has been prepared by vertical Bridgeman process. The p-type cladding layer 402 has a stepped portion, having a higher surface on which the active layer 403 is mounted, and a lower exposed surface. The LED further comprises a p-side Pd/Au electrode 405 and an n-side InGa/Au electrode 406. The p-side electrode 405 is provided on the exposed surface of the p-type cladding layer 402. The n-side electrode 406 is formed on the n-type cladding layer 404. The n-side electrode 406 covers the entire upper surface of the n-type cladding layer 404 and therefore functions as a reflector, as well.

In the structure of FIG. 29, the substrate 401 is made of high-purity, high resistivity ZnSe. The p-type ZnSe cladding layer is 2 µm thick and has an acceptor concentration of $7 \times 10^{17}$ cm$^{-3}$. The CdZnSe active layer 403 has band gap of 2.5 eV and a thickness of 0.3 µm. The n-type ZnSe cladding layer 404 has band gap of 2.7 eV, a thickness of 2 µm and an acceptor concentration of $5 \times 10^{17}$ cm$^{-3}$. The n-side electrode 406 has the same shape and the same size of 200×350 µm, as the n-type cladding layer 404. The p-side electrode 405 is a rectangular plate having a size of 100×350 µm. The LED is generally a square chip, having sides 350 µm long.

An LED of the type shown in FIG. 29 was produced for experimental use. When driven with an operating current of 20 mA, the LED emitted light, with an external quantum efficiency of 10% at emission wavelength of 500 nm. Then, the LED was resin-molded and further tested. It emitted light of luminous intensity as high as 10 cd. The high-luminance emission is attributable to the surface-contact structure the LED had.

Electrons and holes recombine in the active layer 403 located below the n-side electrode 406, whereby light is generated therein. The light is emitted from the ZnSe substrate 401, not shielded by either electrode, and both electrodes 405 and 406 act as reflectors. Hence, the LED acquires high luminous efficiency.

Since the substrate 401 is made of ZnSe, the other components need not be lattice-matched with it. In addition, the p-type cladding layer 406 has but very few defects. This is another factor which greatly contributes to the enhancement of luminous efficiency.

No lattice mismatch occurs in the LED. The operating efficiency of the LED decreases but very little as the LED is driven with a current. The substrate 401 may be formed of GaAs which is a III-V compound semiconductor. If this in the case, the LED is not deteriorated, nor does its luminous efficiency decrease, despite the electromigration which occurs as a current flows through the substrate 401 and the ZnSe cladding layers 402 and 404. In fact, an LED produced and identical to the LED of FIG. 29, but with a substrate made of GaAs, not ZnSe, continuously operated for 10,000 hours or more at the temperature of 30° C.

In the present embodiment, the ZnSe substrate 401 is one prepared by Bridgeman process. Nonetheless, a ZnSe substrate produced by any other process, such as sublimation, may be employed instead.

The transmittance of ZnSe crystal depends on the purity of the crystal and the wavelength of light. The high-purity ZnSe substrate 401 used in this embodiment has a low content of impurities (i.e., Al, Ga, In and Cl), which is 5 ppm or less.

A ZnSe substrate prepared by iodination contains usually about 100 ppm of iodine (impurity). An LED of the type shown in FIG. 29, having emission wavelength of 500 nm, was manufactured, using a ZnSe substrate (500 µm thick) obtained by iodination. When this LED was operated, the substrate absorbed light so much that the light the LED emitted had a low luminous intensity of about 1 to 5 cd. Another LED of the type shown in FIG. 29 was produced, which had a ZnSe substrate (500 µm thick) having a low impurity content of 5 ppm or less and which had an active layer having band gap of 2.3 eV. When operated, this LED emitted light which had luminous intensity of 10 cd or more at wavelength of 530 nm. The research the inventors conducted on this LED revealed that the high luminous intensity had resulted from the improved crystallinity of the cladding layers formed on and above the ZnSe substrate.

In the sixteenth embodiment, the n-side electrode 406 mounted on the n-type cladding layer 404 is used as a reflector, thereby to output light from the substrate 401. Alternatively, the n-side electrode 406 may be made smaller, thus covering only a part of the n-type cladding layer 404, and a reflector may be provided on the entire lower surface of the substrate 401. Then, the light generated in the active layer 403 will be emitted from that surface of the n-type cladding layer 404 which remains not covered by the n-side electrode 406. This is possible for two reasons. First, made of ZnSe, the substrate 401 serves to improve the crystallinity of the active layer 403 (i.e., the light-emitting layer). Second, the substrate 401 is transparent to the light generated in the active layer 403.

Seventeenth Embodiment

Figure 30:
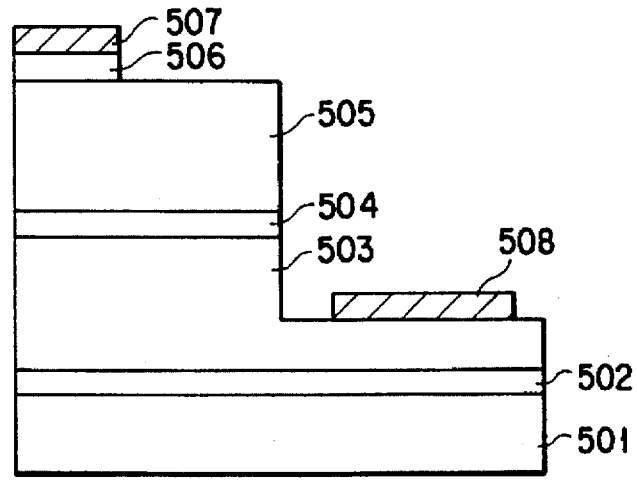
FIG. 30 is a schematic sectional view of a light-emitting diode according to a seventeenth of the invention.

FIG. 30 is a perspective view of an LED according to the seventeenth of the invention.

As illustrated in FIG. 30, this LED comprises a GaAs substrate 501, a p-type InGaP buffer layer 502 provided on the substrate 501, a p-type ZnSe cladding layer 503 formed on the buffer layer 502, an active layer 504 formed on the p-type cladding layer 503 and having a CdZnSe/ZnSe strained quantum well, an n-type ZnSe cladding layer 505 provided on the active layer 504, and an n-type contact layer 506 provided on the n-type cladding layer 505. The p-type cladding layer 503 has a stepped portion, having a higher surface and a lower exposed surface. It is on the higher surface that the active layer 504 is mounted. The LED further comprises an n-side Ti/Au electrode 507 and a p-side Pd/Au electrode 508. The n-side electrode 507 is mounted on the n-type contact layer 506. The p-side electrode 508 is provided on the lower exposed surface of the p-type cladding layer 503.

In the structure shown in FIG. 30, the substrate 501 can be a p-type one, an n-type one, an undoped one, or a high-resistivity (CrO-doped) one. The p-type InGaP buffer layer 502 has a thickness of 200 nm and an acceptor concentration of $2 \times 10^{18}$ cm$^{-3}$. The p-type ZnSe cladding layer 503 is 3 µm or more thick. The active layer 504 has, as mentioned above, a CdZnSe/ZnSe strained quantum well. The n-type ZnSe cladding layer 505 has a thickness of 1 µm and a donor concentration of $6 \times 10^{17}$ cm$^{-3}$. The n-type ZnSe contact layer 506 is 20 nm thick and has a donor concentration of $1 \times 10^{19}$ cm$^{-3}$.

FIG. 32 illustrates how the profile of the acceptor concentration of the p-type ZnSe cladding layer 503 depends upon the underlayer, i.e., the GaAs substrate 501 or the p-type InGaP buffer layer 502. As evident from FIG. 32, the acceptor concentration of a p-type cladding layer 503 formed on the InGaP buffer layer 502 sharply decreases at a greater thickness a p-type cladding layer 503 formed on the GaAs substrate 501. This is because the InGaP buffer layer 502 has been formed the GaAs substrate 501 before the p-type ZnSe cladding layer 503 is made to grow, and both Zn and Se wet well at the interface, making ZnSe grow in a plane and thus forming but very few crystal defects in the resultant ZnSe layer.

At the interface between the GaAs substrate 501 and the p-type ZnSe cladding layer 503, there is a region which is about 0.5 µm thick and in which the acceptor concentration decreases. However, the low-concentration region between the p-type InGaP buffer layer 502 and the n-type ZnSe cladding layer 505 is only 0.05 µm thick, namely one tenth the thickness of the low-concentration region existing between the GaAs substrate 501 and the p-type cladding layer 503. The trend is observed that the acceptor concentration gradually decreases toward the bottom of the p-type ZnSe cladding layer 503. This is because the p-type cladding layer 503 has been annealed while growing.

Thus, in order to reduce the contact resistance it is necessary to locate the p-side electrode 508 above the GaAs substrate 501, at a distance of at least 100 nm therefrom. If the electrode 508 is so positioned, it has but very few crystal defects, such as dislocations, which have been formed at the interface between the GaAs substrate 501 and the p-type buffer layer 502.

The LED similar in structure to the LED of FIG. 30 was produced for experimental use, in which a p-type electrode 507 was provided on a p-type ZnSe cladding layer 503 whose thickness had been reduced by 1 µm from the active layer 504. When driven with an operating current of 20 mA, the LED emitted light having a luminous intensity of 10 cd at wavelength of 530 nm, and continuously operated for 10,000 hours or more.

The use of the InGaP buffer layer is advantageous. When the n-type contact layer 506, the n-type cladding layer 505 and the active layer 504 are etched with a sulfuric acid-based etching solution to expose the p-type cladding layer 503, the etching time is controlled so as to remove that part of the layer 503 which is located 1 µm below from the active layer 504. If this etching method is applied to a large-diameter wafer, the etching rate will differ among the devices being produced on the wafer.

As the etching proceeds to the low-concentration region near the interface shown in FIG. 23, the contact resistance increases greatly, inevitably raising the operating current of the LED. Since any layer formed on an InGaP buffer has a narrow low-concentration region than a layer formed on a GaAs buffer layer, it has a greater etching-depth tolerance.

In fact, 3-inch wafers having an InGaP buffer layer were produced at a yield 50% or more higher than those having a GaAs buffer layer. This is because the p-type cladding layer can be made thinner than in the case it is formed directly on the GaAs substrate and can, therefore, be grown within a shorter time, which increases the productivity of the LED.

In the present embodiment, the buffer layer 502 is made of InGaP. Nonetheless, the layer 502 may be made of other materials such as InGaAlP, AlGaAs, InGaAs and InAlP. Further, the buffer layer 502 can be lattice-matched to either the GaAs substrate 501 or the ZnSe cladding layer 503. It is desired that buffer layer 502 have a superlattice. For example, it should better be a strain GaAs/InGaAs superlattice, wherein InGaAs has a lattice constant which gradually changes from the side contacting the GaAs substrate 501 toward the side contacting the ZnSe cladding layer 503. The thickness of the InGaP buffer layer 502 is not limited to 0.2 µm. Rather, the buffer layer 502 may be 0.05 µm or more, in which case, too, the same advantages can be obtained.

The cladding layers 503 and 505 cladding layers may be formed of material other than ZnSe. They can be made of, for example, ZnSSe. Furthermore, the p-side electrode 508 can be made of Pt/Ti/Pt/Au or Ni/Au, instead of Pd/Au.

Eighteenth Embodiment

Figure 31:
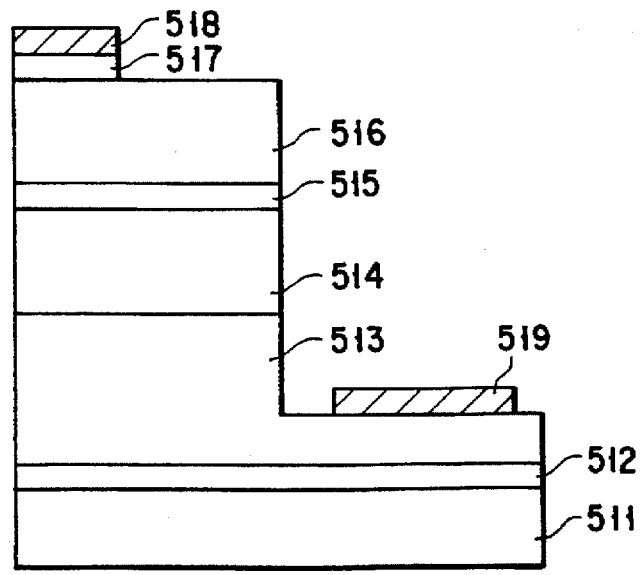
FIG. 31 is a schematic sectional view of a light-emitting diode according to an eighteenth embodiment of this invention.

FIG. 31 is a sectional view of an LED according to an eighteenth embodiment of this invention.

As is shown in FIG. 31, this LED has a GaAs substrate 511. It comprises an InGaP buffer layer 512, a p-type ZnSe contact layer 513, a p-type ZnMgSSe cladding layer 514, an active layer 515, and an n-type ZnMgSSe cladding layer 516, an n-type ZnSe contact layer 517, which are arranged on the substrate 511, one upon another in the order mentioned. The p-type cladding layer 514 is lattice-matched with the p-type ZnSe contact layer 513. The active layer 515 has a strained quantum well made of ZnSSe/ZnSe. The p-type contact layer 513 has a stepped portion, having a higher surface and a lower exposed surface. It is on the higher surface that the cladding layer 514 is mounted. The LED further comprises an n-side Ti/Au electrode 518 and a p-side Pd/Au electrode 519. The n-side electrode 519 is mounted on the n-type contact layer 517. The p-side electrode 519 is provided on the lower exposed surface of the p-type cladding layer 513.

In the structure of FIG. 31, the GaAs substrate 511 can be a p-type one, an n-type one, an undoped one, or a high-resistivity (CrO-doped) one. The p-type InGaP buffer layer 512 has a thickness of 200 nm and an acceptor concentration of $2\times10^{18}$ cm$^{-3}$. The p-type ZnSe contact layer 513 is 2 µm and has an acceptor concentration of $1\times10^{18}$ cm$^{-3}$ in the region at a distance of about µm from the buffer layer 512. The n-type ZnMgSSe cladding layer 514 has a thickness of 1.0 µm and an acceptor concentration of $1\times10^{17}$ cm$^{-3}$. The active layer 515 has, as mentioned above, a ZnSSe/ZnSe strained quantum well. The n-type ZnMgSSe cladding layer 516 has a thickness of 1 µm and a donor concentration of $6\times10^{17}$ cm$^{-3}$. The n-type ZnSe contact layer 517 is 200 nm thick and has a donor concentration of $1\times10^{19}$ cm$^{-3}$.

With a blue-emitting diode which has cladding layers made of ZnMgSSe, it is more difficult to raise the acceptor concentration of the p-type cladding layer than an LED having cladding layers made of ZnSe. Consequently, the voltage greatly drops at the p-side electrode, and the diode will inevitably have a high operating voltage. However, the LED shown in FIG. 31, which is also a blue-emitting diode, has a low operating voltage though both cladding layers 514 and 516 are made of ZnMgSSe, since the p-side electrode 518 is located close to the p-type ZnSe cladding layer 516. P-side electrodes of the type used in this embodiment were made. One of the p-side electrode was provided on a p-type ZnSe layer, and another was on a p-type ZnMgSSe layer.

The contact resistance between the electrode and the p-type ZnSe layer was measured to be $10^{-3}$ Ωcm$^{-2}$, while the contact resistance between the electrode and the p-type ZnMgSSe layer was measured to be $10^{-1}$ Ωcm$^{-2}$.

The LED of the eighteenth embodiment was produced. When driven at an operating voltage of 4V, the LED emitted light having a luminous intensity of 8 cd at wavelength of 470 nm. Since both cladding layers are made of ZnMgSSe which has large band-gap energy.

For purpose of comparison, a conventional LED was made in which the p-side electrode was provided on a p-type ZnMgSSe cladding layer. The conventional LED exhibited an operating voltage of 12V, which is four times higher than the operating voltage of the LED according to the eighteenth embodiment.

How the crystal axis of a substrate influences the crystallinity of ZnSe. In any of the first to eighteenth embodiment that has a GaAs substrate, the major surface of the substrate is (001) face. The inventors conducted an experiment, in which substrate having the same major surface of (001) were prepared and were inclined to crystal axes of [110], [−110], [100] and [010], respectively. (Here, the negative sign "−" means a negative crystal axis.) Then, ZnSe was grown on the major surfaces of these substrates thus inclined. The ZnSe layers formed on the substrates were examined for their etch-pit density (EPD). It was found that the EPD and the inclination of the substrate had the specific relationship shown in FIG. 33.

Figure 33:
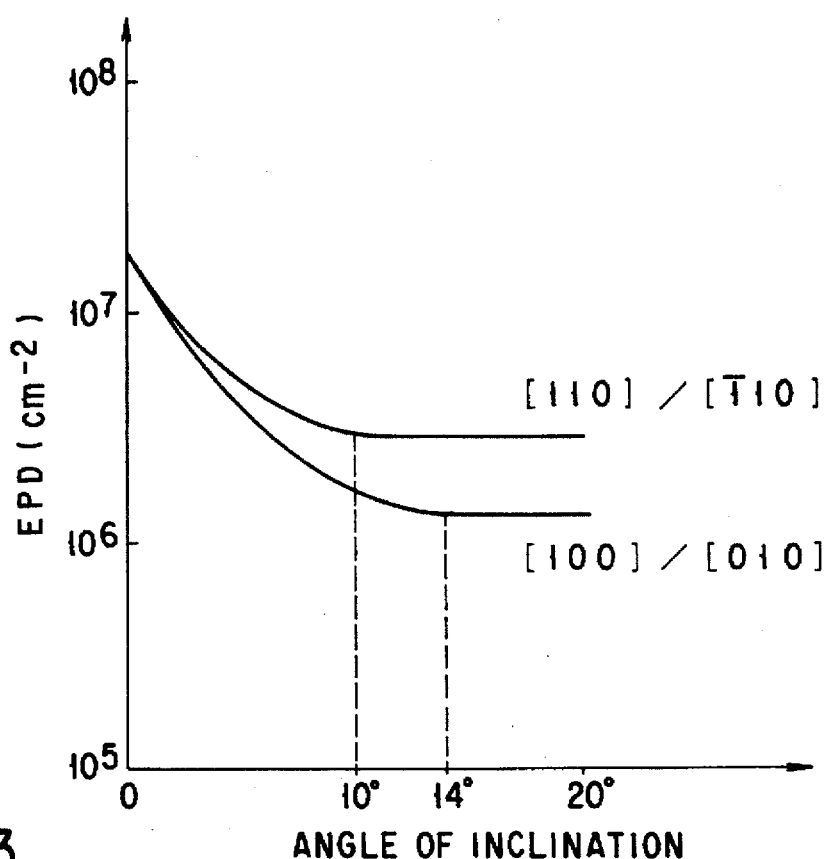
FIG. 33 is a graph showing the relationship between the angle of inclination of a substrate and the etch-pit density (EPD) of the substrate.

As evident from FIG. 33, the EPD was as high as $2\times10^7$ cm$^{-2}$ when ZnSe was grown on (001) face (the inclination angle=0°, that is, the substrate was not inclined at all). The more the substrate was inclined to [110] or [−110] axis, the more the EPD decreased. The EPD was as low about $5\times10^6$ cm$^{-2}$ in the case of the substrate inclined at 10° or more.

The inclination to [110] axis was inclination to face A (i.e., Ga face), and the inclination to [−110] to face B (i.e., As face). The properties of the substrate surface depended upon the direction of inclination of the substrate. However, the same trend was observed in each substrate in terms of the decrease in EPD and the half band width in X rays (to be described later), regardless of the direction of inclination.

In the case of the substrates inclined at 14° or more to [100] or [010] axis, the EPD was $2\times10^6$ cm$^{-2}$, lower by one order than the EPD for the substrate inclined at 0°.

Figure 34:
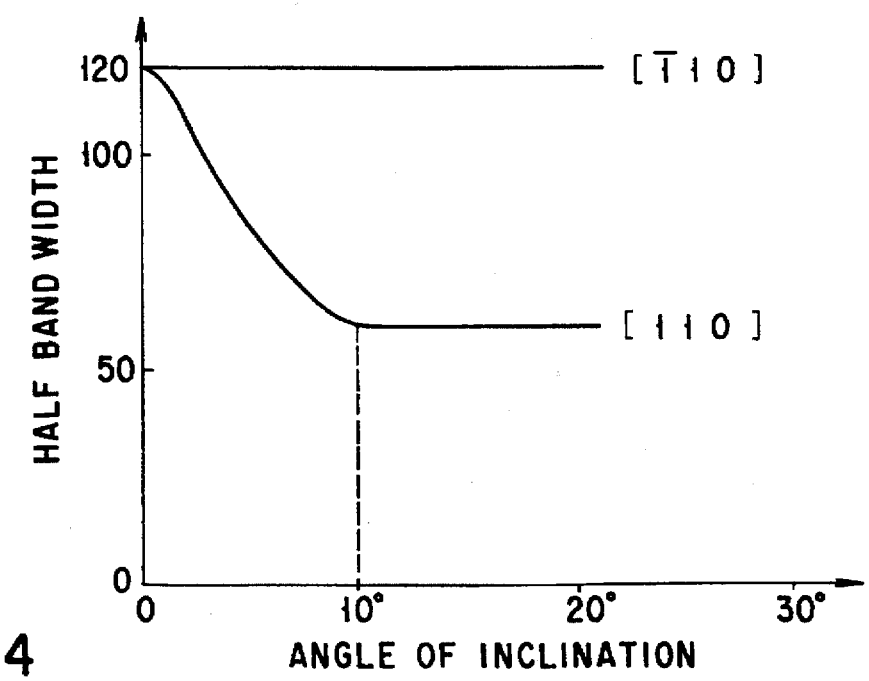
FIG. 34 is a graph representing the relationship between the angle of inclination of the substrate and the half band width in the x-ray diffraction.
Figure 35:
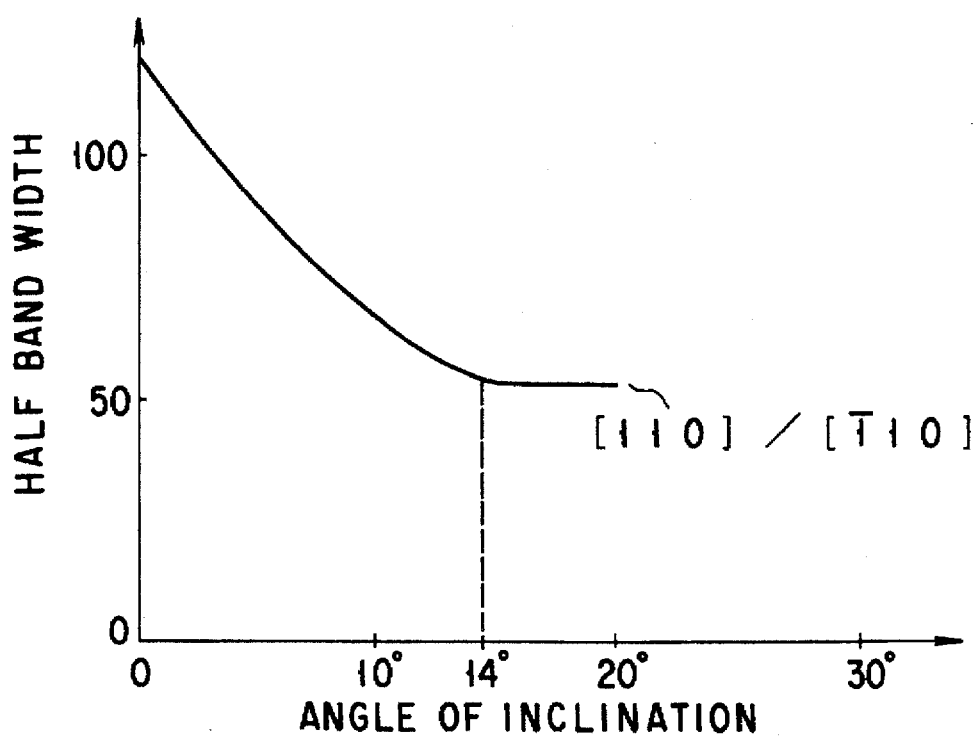
FIG. 35 is a graph representing the relationship between the angle of inclination of the substrate and the half band width in the X-ray diffraction.

FIGS. 34 and 35 represents the relationship between the angle of inclination of the substrate and the half band width in the X-ray diffraction from (400) face.

More precisely, FIG. 34 shows the half band widths in X-ray diffraction along [−110] and [110] axes which took place when the substrate was inclined to [110] axis from (001) face. As seen from FIG. 34, the half band width along [−110] axis remained unchanged, but the half band width along [110] axis decreased as the inclination angle increased. The half band width at an inclination angle of 10° or more was approximately half the value at the inclination angle of 0°. This means that the crystallinity of ZnSe had been improved.

FIG. 35 represents the half band widths in X-ray diffraction along [−110] and [110] axes which took place when the substrate was inclined to [010] axis from (001) face. As is evident from FIG. 35, both the half band width along [−110] axis and the half band width along [110] axis decreased as the inclination angle increased. The half band width at an inclination angle of 14° or more was less than half the value at the inclination angle of 0°. Similar results were observed when the substrate was inclined to [100] axis.

As can be understood from FIGS. 34 and 35, crystal defects or dislocations can be reduced, thus decreasing the half band width and much improving the crystallinity ZnSe if ZnSe is grown on the major surface of a GaAs substrate whose (001) face has been inclined 10° or more to [110] axis or [–110] axis, or at 14° or more to [100] or [010] axis.

The inventors conducted similar experiments on II-VI compound semiconductors other than ZnSe, such as ZnSSe, MgZnSSe and CdZnSe. The results obtained were similar to the results illustrated in FIGS. 34 and 35. Improvement of crystallinity of the compound semiconductor helps to greatly lengthen the lifetime of light-emitting diodes and hence is very important in practice.

Nineteenth Embodiment

Figure 36:
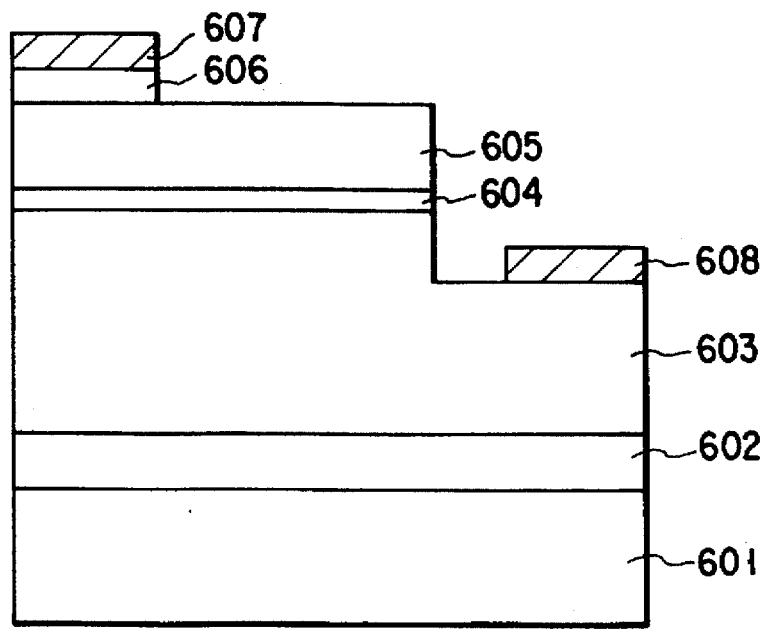
FIG. 36 is a schematic sectional view of a light-emitting diode according to a nineteenth embodiment of the present invention.

FIG. 36 is a sectional view of an LED according to a nineteenth embodiment of the present invention.

As FIG. 36, the LED has a GaAs substrate 601. The substrate 601 has major surfaces inclined at 15° from (001) face to [110] axis. The LED comprises an INGaP buffer layer 602, a p-type ZnSe cladding layer 603, an active layer 604, an n-type ZnSe cladding layer 605 and an n⁺-type ZnSe contact layer 606, which are arranged on the substrate 601, one upon another in the order mentioned. The p-type cladding layer 603 has a stepped portion, having a higher surface and a lower exposed surface. It is on the higher surface that the active layer 604 is mounted. The active layer 604 has a quantum well made of CdZnSe/ZnSe. The LED further comprises an n-side Ti/Au electrode 607 and a p-side Pd/Au electrode 608. The n-side electrode 607 is formed on the n⁺-type contact layer 606. The p-side electrode 608 is mounted on the lower exposed surface of the p-type cladding layer 603.

In the structure illustrated in FIG. 36, the GaAs substrate 601 has, as indicated above, major surfaces inclined at 15° from (001) face to [110] axis. The p-type InGaP buffer layer 602 is lattice-matched with the GaAs substrate 601 and has a thickness of 0.2 µm and an acceptor concentration of $2 \times 10^{18}$ cm$^{-3}$. The p-type ZnSe cladding layer 603 is 3 µm thick. The active layer 604 has a strained Cd$_{0.3}$Zn$_{0.7}$Se/ZnSe quantum well. The n-type ZnSe cladding layer 605 has a thickness of 1 µm and a donor concentration of $6 \times 10^{17}$ cm$^{-3}$. The n⁺-type ZnSe contact layer 606 has a thickness of 0.2 µm and a donor concentration of $1 \times 10^{19}$ cm$^{-3}$.

An LED of the type shown in FIG. 36 was made for experimental use. When driven with an operating current of 20 mA, the LED emitted light which had a high luminous intensity of 10 cd at emission wavelength of 530 nm. The operating voltage of the LED was as low as 4V since the p-side electrode was provided above a layer having a high acceptor concentration. In addition, the LED could continuously operate for 15 hours or more at a high temperature of 50° C., exhibiting high reliability. This is because the substrate was inclined to have its crystallinity improved.

In the present embodiment, the GaAs substrate 601 has a major surface inclined at 15° from (001) face to [110] axis. Alternatively, its major surfaces may be inclined at 10° or more to [110] or [–110] axis, or at 14° or more to [100] or [010] axis. If this is the case, the same advantages as described above can be attained, as well. Both cladding layers 603 and 605 may be formed of a CdZnMgTeSSE-based material other than ZnSe—such as ZnSSe or MgZnSSe. In this case, too, the same advantages can be achieved.

Twentieth Embodiment

Figure 37:
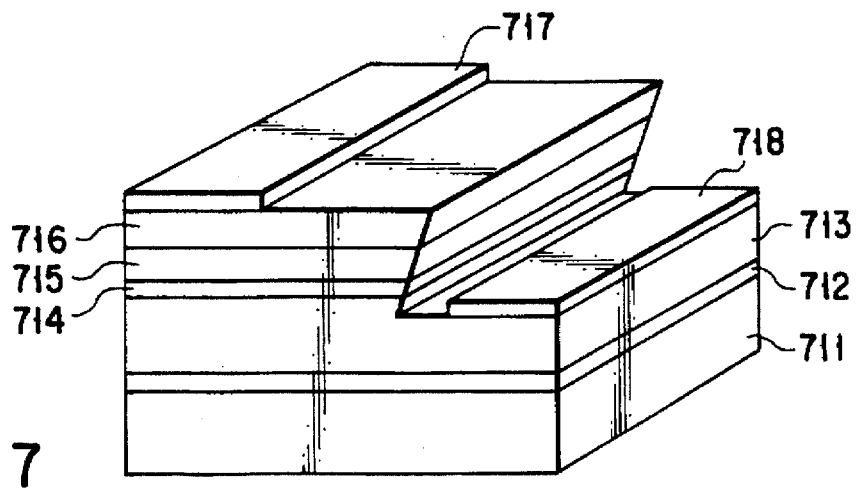
FIG. 37 is a schematic perspective view of a light-emitting diode according to a twentieth embodiment of the invention.
Figure 38:
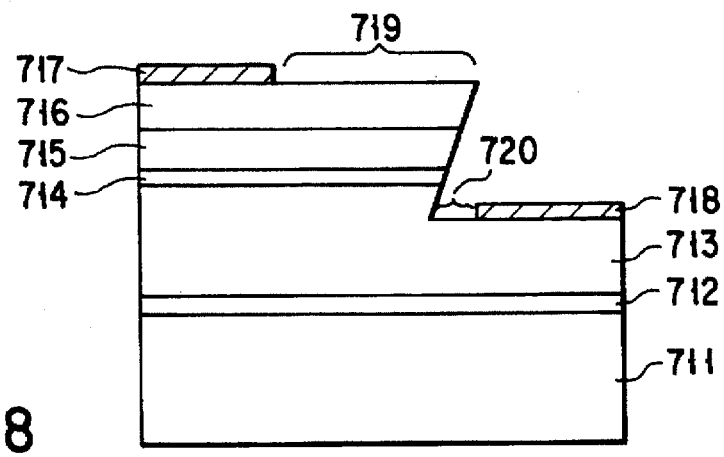
FIG. 38 is a sectional view of the light-emitting diode shown in FIG. 37.
Figure 39:
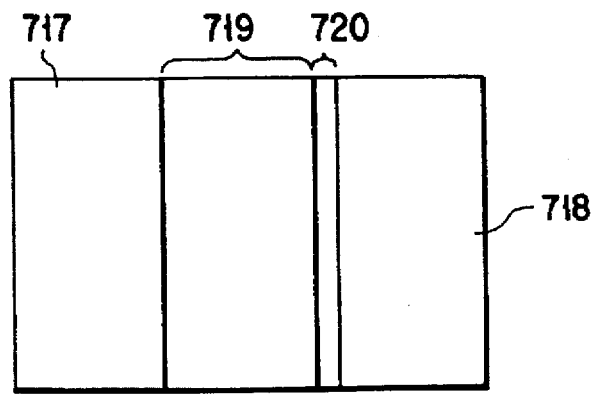
FIG. 39 is a plan view of the light-emitting diode shown in FIG. 37.

FIGS. 37, 38 and 39 are a perspective view, a sectional view and a plan view of an LED according to a twentieth embodiment of the invention.

As shown in FIGS. 37, 38 and 39, the LED comprises a GaAs substrate 711, a ZnMgSeS/ZnSeS Bragg reflection layer 712, a p-type ZnSe cladding layer 713, an active layer 714, an n-type ZnSe cladding layer 715, an n-type ZnSe contact layer 716. The layers 712, 713, 714, 715 and 716 are arranged on the substrate 711, one upon another in the order mentioned. The p-type cladding layer 713 has a stepped portion, having a higher surface and a lower exposed surface. It is on the higher surface that the active layer 714 is mounted. The active layer 714 has a strained quantum well made of CdZnSe/ZnSe. The LED further comprises an n-side Ti/ITO (Indium Tin Oxide) electrode 717 and a p-side Pd/Ti/Pt/Au electrode 718. The n-side electrode 717 is formed on the n-type ZnSe contact layer 716. The p-side electrode 718 is mounted on the lower exposed surface of the p-type cladding layer 713.

The substrate 711 is a semi-insulating GaAs substrate having a (001) face. The Bragg reflection layer 712 is a ZnMgSeS/ZnSeS multilayered member and is lattice-matched with the GaAs substrate 711. The p-type cladding layer 713 has a thickness of 3 µm and an acceptor concentration of $1 \times 10^{18}$ cm$^{-3}$. The active layer 714 has a strained quantum well which consists of a Cd$_{0.3}$Zn$_{0.7}$Se well layer and a ZnSe barrier layer. The n-type ZnSe cladding layer 715 has a thickness of 0.5 µm and a donor concentration of $6 \times 10^{17}$ cm$^{-3}$. The n-type ZnSe contact layer 716 has a thickness of 0.5 µm and a donor concentration of $1 \times 10^{19}$ cm$^{-3}$.

The LED is generally a rectangular chip, having shorter sides 250 µm long, extending along [–110] axis, and longer sides 500 µm, extending along [110] axis. The n-side electrode 717 is a multilayer member comprised of a Ti film 6.5 nm thick and an ITO film 300 nm thick, has a width of 150 µm and extends along [110] axis. The lower exposed surface of the n-type cladding layer 713 has a width of 195 µm. The p-side electrode 718 mounted on the lower exposed surface of the layer 713 has a width of 150 µm. That portion of the n-type cladding layer 713 which is not covered with the p-side electrode 713 has a width 150 µm and functions as a region 720 for preventing electromigration.

An LED identical in size and structure to the one shown in FIG. 36 was made for experimental use. When driven with an operating current of 20 mA and an operating voltage of 4V, the LED emitted light current-diffusing layer 807 which had a high luminous intensity of 10 cd at central emission wavelength of 530 nm. This high-luminance emission can be attributed to the predominant electron-hole recombination which occurs in that part of the active layer 714 which is located right below the exposed portion 719 of the n-type cladding layer 716.

In the twentieth embodiment, the n-side electrode 717 is a multilayered member made up of a Ti electrode 10 an ITO electrode provided on the Ti electrode. The electrode 717 is so structured for two reasons. First, titanium (Ti) has a work-function level similar to the Fermi level of n-type ZnSe, enabling the n-side electrode 717 to readily form an ohmic contact together with the n-type ZnSe contact layer 716. Secondly, the ITO electrode is transparent, allowing the passage of the light generated beneath the n-side electrode 171 and making it possible to emit the light from the upper surface of the electrode 171. Obviously this increases the luminous efficiency of the LED.

It is desired that the Ti film have a thickness ranging from 5 to 30 nm. So long as the thickness of the Ti film falls within this range, ITO is effectively prevented from diffusing into the n-type ZnSe contact layer 716, without reducing the transmittance the ITO film exhibits to light beams falling in the emission wavelength range of the LED.

As seen from FIGS. 37 and 38, the LED has a stepped portion shaped like an inverted mesa. The stepped portion has (111) face and a vertical wall inclined along [−110] axis. Electron-hole recombination can therefore be suppressed in that side of the active layer 714 which is exposed at the stepped portion. The face orientation of the stepped portion may be changed by 90° so that the vertical wall is inclined along [110] axis. In this case, that side of the active layer 714 which is exposed at the stepped portion can easily be rendered flat and smooth. As a result, electron-hole recombination is effectively suppressed in said exposed side of the active layer 714.

The acceptor concentration of the p-type ZnSe cladding layer 713 decreases toward the substrate 711 since the p-type cladding layer 713 has been annealed while growing. Despite this, the contact resistance of the p-type cladding layer 713 can be reduced to 0.1 Ωcm or less if the p-type cladding layer 713 is etched to a level 0.5 μm or more below the interface between the layer 713 and the active layer 614 and if the p-side Pd/Ti/Pt/Au electrode 718 is provided on the surface of the p-type cladding layer 713. To be more specific, this reduction of contact resistance is attained when the cladding layer 713 is etched to a level 0.5 μm or more (measured in the direction the p-type ZnSe crystal is grown) below said the interface if the layer 713 is provided above a GaAs layer, as can be understood from FIG. 32. Also, this reduction of contact resistance is achieved when the layer 713 is etched to a level 0.05 μm or more below said interface if an InGAAlP-based buffer layer is inserted, as can be seen from FIG. 32.

In the case where ZnSe crystal is grown on a substrate of a III-V compound semiconductor, dislocations occur in high density in that portion of the resultant ZnSe layer which is 2 μm deep from the growth interface. Dislocations will shorten the lifetime of the LED. If the density of dislocations is limited to $1\times10^5$ cm$^{-2}$ or less, the maximum acceptor concentration in the p-type ZnSe layer can be as high as $5\times10^{17}$ cm$^{-3}$. Hence it is desirable to form the p-type electrode 718 at a level 2 μm or more above the interface between the substrate and the ZnSe crystal, where ZnSe crystal has started to grow. Then, the current injected from the surface of the LED will not be supplied to that interface, the contact resistance will be sufficiently low, and the dislocations will scarcely shorten the lifetime of the LED.

At the interface between the p-type ZnSe cladding layer 713 and the p-side Pd/Ti/Pt/Au electrode 718, however, electromigration will occur if a large current is injected for a long time. Consequently, the metal of the p-side electrode 718 will diffuse into the p-type cladding layer 713 in some case. To prevent this undesired diffusion of metal, it suffices to interpose a barrier metal layer (e.g., a Ti layer) between the p-side electrode 718 and the p-type cladding layer 713.

The region 720 of the p-type cladding layer 713 prevents the diffusion of metal into the p-side electrode 718. If made 5μm or more broad, the region 720 can effectively prevent Pd from diffusing into the active layer 714, whereby the LED may operate for 10,000 hours at the temperature of 50° C.

Besides a Pd/Ti/Pt/Au electrode, there are electrodes which can maintain a low contact resistance, which can functions as a barrier metal layer and which can be sufficiently adhesive. One example is a multi-layered electrode comprised of an Ni film and an Au film.

The twentieth embodiment has ZnSe layers which are not lattice-matched with the GaAs substrate 711. The ZnSe layers may be replaced by layers of any other material, in which case the same advantages can be expected to result in. ZnMgSeS layers which are lattice-matched with the GaAs substrate 711, for example, may be used instead.

The conductivity type of every layer can be altered, provided that the advantages of the invention are preserved. In this case, the n-type ZnSe contact layer 716 should be replaced by a superlattice layer comprised of a p-type ZnSe film and a p-type ZnTe film since it is difficult to form a p-type ZnSe contact layer having a high impurity concentration, and the p-side electrode 718 should be made up of a Pd film and an ITO film. Then, the LED will accomplish high-luminance emission.

As indicated above, the substrate 711 is a semi-insulating GaAs substrate having a (001) face. Nonetheless, the GaAs substrate 711 may be replaced by an inclined substrate or a semiconductor substrate (either, p-type or n-type). Moreover, the unti-reflection film may be provided on the exposed surface of the p-type ZnSe cladding layer 713.

Twenty-First Embodiment

Figure 40A:
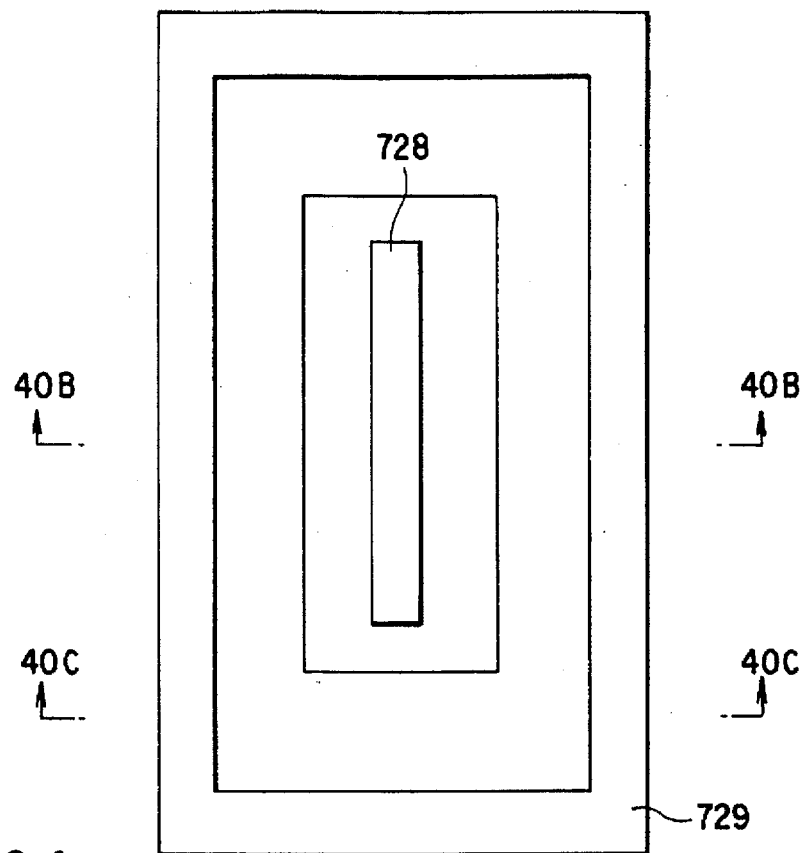
FIG. 40A is a schematic plan view of a semiconductor laser according to a twenty-first embodiment of the invention.
Figure 40B:
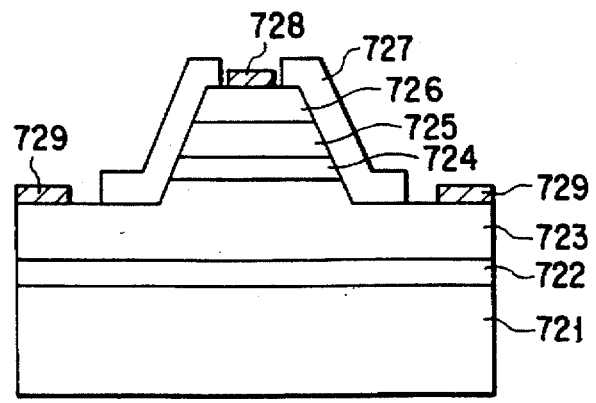
FIG. 40B is a sectional view of the laser, taken along line 40B—40B in FIG. 40A.
Figure 40C:
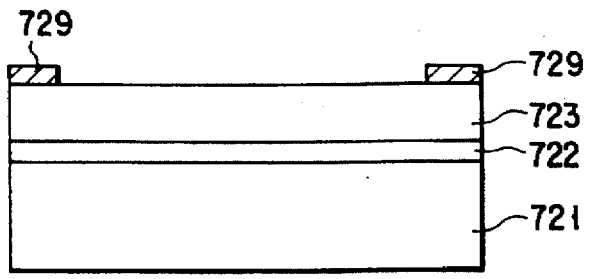
FIG. 40C is a sectional view of the laser, taken along line 40C—40C in FIG. 40A.

FIG. 40A is a plan view of a semiconductor layer according to the twenty-first embodiment of the invention, and FIGS. 40B and 40C are, respectively, a sectional view taken along line 40B—40B in FIG. 40A and a sectional view taken along line 40C—40C in FIG. 40A.

As is clearly shown in FIGS. 40A, 40B and 40C, the laser comprises a GaAs semi-insulating substrate 721, an InGaAlP buffer layer 722, a p-type ZnSe cladding layer 723, an active layer 724, an n-type ZnSe cladding layer 725, an n-type ZnSe contact layer 726, and a ZnS passivation layer 727. The active layer 724 has a strained quantum well which consists of a $Cd_{0.3}Zn_{0.7}Se$ well layer and a ZnSe barrier layer. The p-type ZnSe cladding layer 723 has a stepped portion, a higher rectangular exposed surface and a lower frame-shaped exposed surface which is concentric to the higher surface. It is on the higher surface that the active layer 724, the n-type ZnSe cladding layer 725 and the n-type ZnSe contact layer 726 are arranged, one upon another, constituting a mesa portion. The mesa portion is 20 μm broad and 2.5 μm tall. The passivation layer 727 is shaped like a hollow cone, having a thickness of 1 μm and covering part of the lower exposed surface of the p-type cladding layer 723, the sides of the mesa portion and part of the upper surface of the contact layer 726.

The laser further comprises an n-side electrode 728 and a p-side electrode 729. The n-side electrode 728 is a rectangular strip made of a Ti film (6.5 nm thick) and an Au film (300 nm thick), provided on the contact layer 726 and having a width of 10 μm. The p-side electrode 729 is shaped like a frame, comprised of a Pd film, a Ti film and an Au film, provided on the lower exposed surface of the p-type cladding layer 723, and surrounds the mesa portion.

The p-type ZnSe cladding layer 723 has a thickness of 3 μm and an acceptor concentration of $1\times10^{18}$ cm$^{-3}$. The n-type ZnSe cladding layer 725 has a thickness of 1.5 μm and a donor concentration of $6\times10^{17}$ cm$^{-3}$. The n-type ZnSe contact layer 726 has a thickness of 0.5 μm and a donor concentration of $1\times10^{19}$ cm$^{-3}$.

A semiconductor laser identical in size and structure to the one shown in FIGS. 40A, 40B and 40c was manufacture by cleavaging a wafer over a resonator length of 1 mm. When driven with a threshold current of 30 mA, the laser performed room-temperature continuous laser emission at emission wavelength of 530 nm and optical output of 300 mW. The laser emission was so achieved since the holes injected sideways from the p-type cladding layer 723 recombined in the active layer 724 with the electrons vertically injected from the ZnSe cladding layer 725. The electron-hole recombination produced an optical gain large enough to develop laser emission.

The acceptor concentration of the p-type ZnSe cladding layer 723 decreases toward the substrate 721 since the cladding layer 723 has been annealed while growing. Despite this, the contact resistance of the layer 723 can be reduced sufficiently by providing the p-side Pd/Ti/Pt/Au electrode 729 on the surface of the layer 723 which has been etched to a level 0.5 µm or less from the interface between the layer 723 and the active layer 724.

Also, the contact resistance can be reduced to that degree by etching the layer 723 to a level 0.05 µm or more from the interface if an InGAAlP-based buffer layer is inserted in the direction the p-type ZnSe crystal has grown—as can be seen from FIG. 32. In the case ZnSe crystal has been grown on a substrate of III-V compound semiconductor, the influence of dislocations is prominent to a level 2 µm from the ZnSe-growth interface. Therefore, in the present embodiment, the p-side electrode 729 is provided at a distance of 2 µm or more from the ZnSe-growth interface, so that a current is injected, exclusively from the surface of the laser. As a result, no current is injected to the interface, decreasing the contact resistance of the layer 723 and adequately reducing the influence of dislocations.

In the structure of FIGS. 40A to 40C, not only the voltage drop in the p-type ohmic contact is reduced greatly, but also holes are injected sideways uniformly. The laser can therefore effect laser oscillation at a low threshold current.

In the structure of FIGS. 40A to 40C, not only the voltage drop in the p-type ohmic contact is reduced greatly, but also holes are injected sideways uniformly. The laser can therefore effect laser oscillation at a low threshold current.

The twenty-first embodiment has ZnSe layers which are not lattice-matched with the GaAs substrate 721. The ZnSe layers may be replaced by layers of any other material, in which case the same advantages can be expected to result in. ZnMgSeS layers which are lattice-matched with the GaAs substrate 721, for example, may be used instead. Further, the conductivity type of the layers can be altered, provided that the advantages of the invention are preserved. Still further, the material of the substrate 721 is not limited to semi-insulating one. Rather, the substrate 721 can be formed of conductive material.

Since the passivation layer 727 covers the active layer 724, preventing electron-hole recombination which may otherwise occur at the sides of the active layer 724. Made of single-crystal ZnS which has greater large band gap and smaller refractive index than ZnSe, the passivation layer 727 can effectively block a current and effectively confine light. Nevertheless, the layer 727 may be made of polycrystalline ZnS, instead of single-crystal ZnS, provided it can well block a current and confine light. Furthermore, the layer 727 may be formed of another material, such as an oxide, a nitride or ZnMgSeS-based single crystal.

Twenty-Second Embodiment

Figure 41:
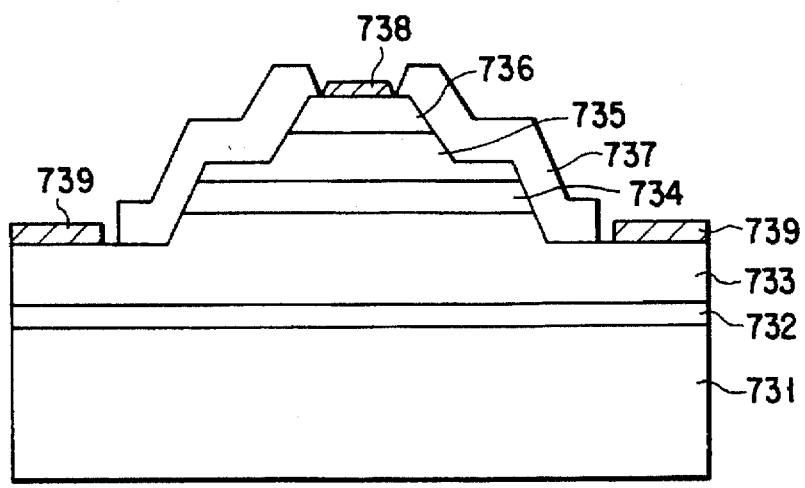
FIG. 41 is a schematic sectional view of a semiconductor laser according to a twenty-second embodiment of the present invention.

FIG. 41 is a sectional view of a semiconductor laser according to a twenty-second embodiment of the present invention.

As illustrated in FIG. 41, the semiconductor laser comprises a GaAs semi-insulating substrate 731, an InGaAlP buffer layer 732, a p-type ZnSe cladding layer 733, an active layer 734, an n-type ZnSe cladding layer 735, an n-type ZnSe contact layer 736, and a ZnS passivation layer 737. The active layer 734 has a strained quantum well which consists of a $Cd_{0.3}Zn_{0.4}Se$ well layer and a ZnSe barrier layer. The p-type ZnSe cladding layer 733 has a stepped portion, a higher rectangular surface and a lower frame-shaped exposed surface which is concentric to the higher exposed surface. It is on the higher surface that the active layer 734, the n-type ZnSe cladding layer 735 and the n-type ZnSe contact layer 736 are arranged, one upon another, in the order mentioned, thus constitute a double mesa portion. The double mesa portion has a top rectangular surface having a width of 15 µm (i.e., the width of the contact layer 736). The n-type ZnSe cladding layer 735 has a stepped portion, having a higher exposed surface and a lower exposed surface. The lower exposed surface of the layer 735 is frame shaped, having a width of 15 µm. The lower portion of the layer 735 has a thickness of 0.2 µm. The passivation layer 737 is shaped like a hollow cone, having a thickness of 1 µm and covering part of the lower exposed surface of the p-type cladding layer 733, the sides of the mesa portion and part of the upper surface of the contact layer 736.

The semiconductor laser further comprises an n-side electrode 738 and a p-side electrode 739. The n-side electrode 738 is a rectangular strip made of a Ti film (6.5 nm thick) and an Au film (300 nm thick), provided on the contact layer 736 and having a width of 10 µm. The p-side electrode 739 is shaped like a frame, comprised of a Pd film, a Ti film and an Au film, provided on the lower exposed surface of the p-type cladding layer 733, and surrounds the double mesa portion.

The p-type ZnSe cladding layer 733 has a thickness of 3 µm and an acceptor concentration of $1 \times 10^{18}$ cm$^{-3}$. The n-type ZnSe cladding layer 735 has a thickness of 1.5 µm and a donor concentration of $6 \times 10^{17}$ cm$^{-3}$. The n-type ZnSe contact layer 736 has a thickness of 0.5 µm and a donor concentration of $1 \times 10^{19}$ cm$^{-3}$.

A semiconductor layer identical in size and structure to the one shown in FIG. 41 was produced by cleavaging a wafer over a resonator length of 1 mm. When driven with a threshold current of 30 mA, the laser performed room-temperature continuous laser emission at emission wavelength of 530 nm and optical output of 300 mW.

The twenty-second embodiment is characterized by the double mesa portion. The double mesa portion guides the electrons injected vertically from the n-side electrode 738 into the n-type ZnSe cladding layer 735, through a narrow path. The electrons are therefore confined in a region of the active layer 734, which has a width of only about 15 µm. Hence, the electron-hole recombination at the interface between the active layer 734 and the passivation layer 737 is readily suppressed.

The laser shown in FIG. 41 can effect laser oscillation at a low threshold current, for some reasons. First, the voltage drop in the p-type ohmic contact is reduced greatly. Second, holes are injected sideways uniformly. Third, electrons are injected through a narrow path and ultimately confined in a narrow region of the active layer 734.

Like the twenty-first embodiment (FIGS. 40A to 40C), the twenty-second embodiment can be modified in various ways, by changing the material of the layers and altering the conductivity type of each layer.

Twenty-Third Embodiment

Figure 42:
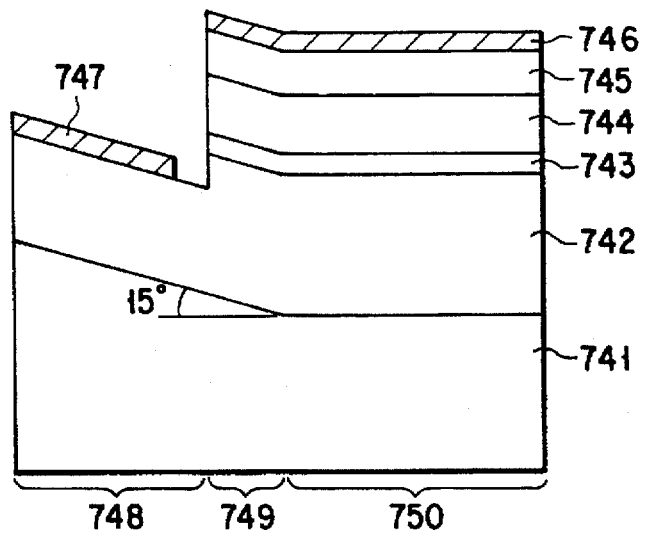
FIG. 42 is a schematic sectional view of a semiconductor laser according to a twenty-third embodiment of the invention.

FIG. 42 is a schematic sectional view of a semiconductor laser according to a twenty-third embodiment of the invention.

As FIG. 42 shows, this laser comprises a GaAs semi-insulating substrate 741, a p-type ZnSe cladding layer 742, an active layer 743, an n-type ZnSe cladding layer 744, an n-type ZnSe contact layer 745. The active layer 743 has a strained quantum well which consists of a $Cd_{0.3}Zn_{0.4}Se$ well layer and a ZnSe barrier layer. The GaAs substrate 741 is formed of three parts 748, 749 and 750. The top surface of the part 750 is (001) face. The part 749 has a width of 10 μm and has its top surface inclined upward at 15° to the (001) face. The part 748 has a width of 10 μm and has its top surface inclined upward at 15° to the (001) face and aligned with the top surface of the part 749. The p-type cladding layer 742 has a stepped portion, having a higher surface and a lower exposed surface. It is on the higher exposed surface that the layers 743, 744 and 745 are provided, one upon another, in the order mentioned.

The laser further comprises an n-side electrode 746 and a p-side electrode 747. The n-side electrode 746 is a rectangular strip made of a Ti film (6.5 nm thick) and an Au film (300 nm thick), provided on the contact layer 745. The p-side electrode 747 is provided on the lower exposed surface of the p-type cladding layer 742. The lower exposed surface of the layer 742 has a portion not covered with the p-side electrode 747.

The p-type ZnSe cladding layer 742 has a thickness of 3 μm and an acceptor concentration of $1 \times 10^{18}$ cm$^{-3}$. The n-type ZnSe cladding layer 744 has a thickness of 1.5 μm and a donor concentration of $6 \times 10^{17}$ cm$^{-3}$. The n-type ZnSe contact layer 745 has a thickness of 0.5 μm and a donor concentration of $1 \times 10^{19}$ cm$^{-3}$.

A semiconductor layer of the same size and structure as the laser shown in FIG. 42 was manufacture for experimental purpose. When driven with a threshold current of 30 mA, the laser performed room-temperature continuous laser emission at emission wavelength of 530 nm and optical output of 300 mW.

In this semiconductor laser, holes are injected sideways from the p-type cladding layer 742 into the active layer 743. In the active layer 743, the holes recombine with the electrons which have been vertically injected from the ZnSe cladding layer 725. The electron-hole recombination produces an optical gain large enough to develop laser emission.

As is known, p-type ZnSe grown by MBE method on a substrate having major surfaces inclined at 145° to (001) face has a higher acceptor concentration than p-type ZnSe which has been grown by the same method on substrate having major surfaces not inclined at all to (001) face. Therefore, in the structure shown in FIG. 42, that portion of the active layer 743 which is located above the inclined part 749 of the substrate 741 can provide an optical gain.

The acceptor concentration of the p-type ZnSe cladding layer 742 decreases toward the substrate 741 since the cladding layer 742 has been annealed while growing. Despite this, the contact resistance of the layer 742 can be reduced sufficiently by providing the p-side Pd/Ti/Pt/Au electrode 747 on the surface of the layer 742 which has been etched to a level 0.5 μm or less from the interface between the layer 742 and the active layer 743.

In the structure of FIG. 42, not only the voltage drop in the p-type ohmic contact is reduced greatly, but also holes are injected sideways uniformly. The laser can therefore effect laser oscillation at a low threshold current.

The twenty-third embodiment has ZnSe layers which are not lattice-matched with the GaAs substrate 741 The ZnSe layers may be replaced by layers of any other material, in which case the same advantages can be expected to result in. ZnMgSeS layers which are lattice-matched with the GaAs substrate 741, for example, may be used instead. Further, the conductivity type of the layers can be altered, provided that the advantages of the invention are preserved. Still further, the material of the substrate 741 is not limited to semi-insulating one. Rather, the substrate 741 can be formed of conductive material.

Twenty-Fourth Embodiment

Figures 43, 44:
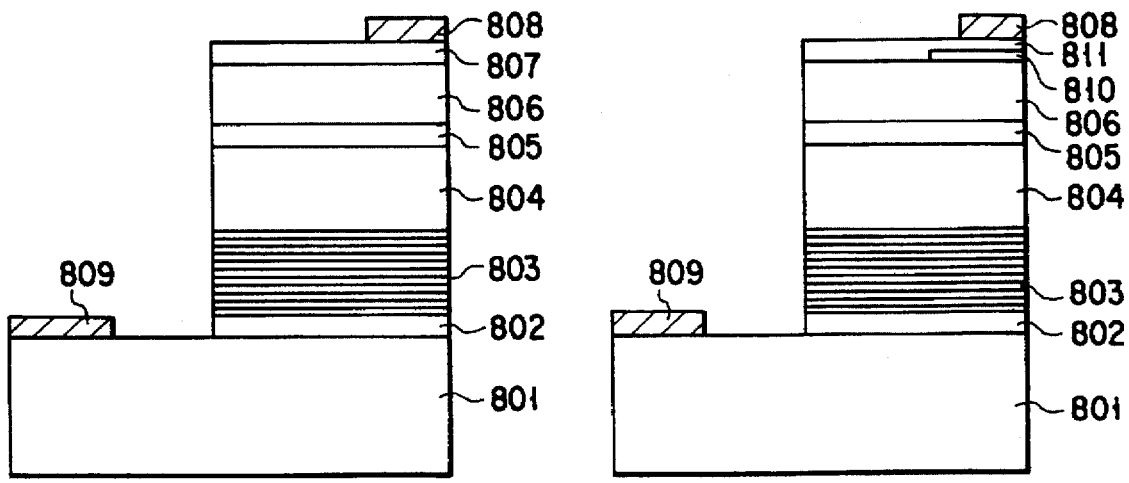
FIG. 43 is a schematic sectional view of a light-emitting diode according to a twenty-fourth embodiment of this invention.
FIG. 44 is a sectional view of a modification of the light-emitting diode shown in FIG. 43.

FIG. 43 is a sectional view of an LED according to the twenty-fourth embodiment of this invention.

The LED has a p-type GaAs substrate 801. It comprises a p-type InGaP current-guiding layer 802, a p-type Bragg reflecting layer 803, a p-type $In_{0.5}(Ga_{1-l}Al_l)_{0.5}P$ cladding layer 804, an $In_{0.5}(Ga_{1-m}Al_m)_{0.5}P$ active layer 805, an n-type $In_{0.5}(Ga_{1-n}Al_n)_{0.5}P$ cladding layer 806, and n-type current-diffusing layer 807, which are provided on the substrate 801, one upon another, in the order mentioned. The Bragg reflecting layer 803 is comprised of 10 two-layer members, each formed of an InAlP film and an InGaAlp film. The LED further comprises an n-side metal electrode 808 and a p-side metal electrode 809. The n-side electrode 807 is provided on the upper surface of the current-diffusing layer 807. The p-side electrode 809 is mounted on the upper major surface of the substrate 801.

The InGaAlP layers 804, 805 and 806, which constitute a double-hetero junction, have compositions wherein m≦1 and m≦n, so that the LED may have high luminous efficiency. In the double-hetero junction, the active layer 805 (i.e., the light-emitting layer) has a smaller energy gap than the cladding layers 804 and 806. These InGaAlP layers 804, 805 and 806 are lattice-matched with the GaAs substrate 801.

The n-type current-diffusing layer 807 is made of such a material that it is transparent to the light generated in the active layer 805. More correctly, the layer 807 is made of ITO (Indium Tin Oxide) which is an oxide semiconductor. Although the LED has a double-hetero junction, the structure of its active layer is not essential. The active layer 805 may have a single-hetero junction, a homogeneous junction or a quantum well. Alternatively, the active layer 805 may be one which has a lattice strained with respect to the substrate 801.

The layers of the structure illustrated in FIG. 43 have each a thickness and a carrier concentration, which are specified as follows:

| | |
|---|---|
| Current-guiding layer 802: | 0.05 μm, $5 \times 10^{17}$ cm$^{-3}$ |
| P-type cladding layer 804: | 1.0 μm, $5 \times 10^{17}$ cm$^{-3}$ |
| Active layer 805: | 0.3 μm, undoped |
| N-type cladding layer 806: | 1.0 μm, $5 \times 10^{17}$ cm$^{-3}$ |
| Current-diffusing layer 807: | 0.3 μm, $1 \times 10^{20}$ cm$^{-3}$ |

Each of the films forming the p-type InAlP/InGaAlP Bragg reflection layer 803 has an optical thickness of $\lambda_0/4$, where $\lambda_0$ is the wavelength of the light generated in the active layer 805. The films constituting the reflection layer 803 have a carrier concentration of $5 \times 10_{15}$ cm$^{-3}$ or more.

The LED of this embodiment differs from the conventional one in two respects. First, the p-side electrode 809 is provided on the same major surface of the substrate 801 as the layers which form the component layers of the LED. Second, the current-diffusing layer 807 is made of TIO. These technical points results in the following advantages:

ITO, which is the material of the layer 807, is a good conductor, having resistivity much lower than that of InGaAlP which is the material of the n-type cladding layer 806. To state more specifically, ITO has resistivity of $5 \times 10^{-4} \Omega cm$, whereas InGaAlP has resistivity of $1 \times 10^{-1} \Omega cm$. Thus, the current injected from the n-side metal electrode 808 greatly diffuses in the surface region of the LED, expanding a light-emitting region within the active layer 805. The LED has its luminous efficiency substantially enhanced.

Since the metal electrodes 808 and 809 are staggered, not sandwiching the active layer 805, as shown in FIG. 43, the current injected can diffuse into the parts of the active layer 805, other than that part positioned right below the electrode 808. This also helps to increase the luminous efficiency of the LEd.

An LED of the structure shown in FIG. 43, which had an $In_{0.5}(Ga_{1-m}Al_m)_{0.5}P$ active layer, where m is 0.5, was made for experimental use. When driven a current, while applying a voltage in the forward direction, the LED emitted light from the exposed surface of the current-diffusing layer 807, which had high luminous intensity of 3 cd or more at peak wavelength of 555 nm.

In short, since the current-diffusing layer is made of ITO and the electrodes do not sandwich the active layer, the light-emitting region can be expanded in the active layer 805. The light generated in the layer 805 can therefore be emitted efficiently.

Moreover, the LED can be modified as shown in FIG. 44, by interposing a p-type InGaAlP current-blocking layer 810 between the n-type cladding layer 806 and the current-diffusing layer 807. The current-blocking layer 810 reduces the reactive current flowing into that part 811 of the current-diffusing layer 807 which is located below the n-side metal electrode 808. Hence, the luminous efficiency of the LED can be even more improved.

Twenty-Fifth Embodiment

FIG. 45 is a sectional view of an LED according to the twenty-fifth embodiment of the present invention. The components of the LED, which are similar or identical to those shown in FIG. 43, are denoted at the same reference numerals in FIG. 45 and will not be described in detail.

This LED differs from the twenty-fourth embodiment (FIG. 43) in two respects. First, the p-side metal electrode 809 is used instead of the reflection layer 803 and is provided on a reflection layer, not on the substrate 801. Second, as seen from FIG. 45, the reflection layer is a three-layered one which consists of a p-type InAlP/GaAs film 821, a p-type InAlP/InGaAlP film 822 and a p-type current-guiding film 823. These films 821, 822 and 823 differ in their light-reflecting property. Except for the use of the reflection layer, the LED is identical to the LED of the twenty-fourth embodiment in all features (such as the thickness and carrier concentration of each layer).

The reflection layer may have any other structure, and the materials of its component films may be changed, so long as the reflection layer electrically connects the p-type cladding layer 804 to the p-side electrode 809. In other words, the reflection layer can be more easily modified in structure and materials than the reflection layer 803 incorporated in the twenty-fourth embodiment.

Made up of films 821, 822 and 823, the reflection layer has high reflectance to a broad range of wavelength. It therefore serves to enhance the luminous efficiency of the LED. Further, the use of the three-layered reflection layer helps to increase the mass-productivity and reproducibility of the LED.

Twenty-Sixth Embodiment

FIG. 46 is a sectional view of an LED according to the twenty-sixth embodiment of the present invention. The components of the LED, which are similar or identical to those shown in FIG. 43, are denoted at the same reference numerals in FIG. 46 and will not be described in detail.

This LED differs from the twenty-fourth and twenty-fifth embodiments (FIG. 43 and FIG. 45) in that the p-side metal electrode 809 differs in two respects. First, the p-side metal electrode 809 is formed on the p-type cladding layer 804. Second, a contact layer 831 (either a p-type GaAs layer or a p-type GaAs/InGaP layer) is provided to electrically connect the p-type cladding layer 804 to the p-side electrode 809.

This makes it possible to alter the structure, conductivity type and material of the reflection layer 803. Namely, the LED having the reflection layer 803 having high reflectance to a broad range of wavelength can be manufactured easily.

In the twenty-fourth to twenty-sixth embodiments, the reflection layer is made of InGaAlP-base material and GaAlAs-based material. Alternatively, the reflection layer may be formed of a III-V compound semiconductor such as InGaAsP-based material or InGaAlN-based material, or a II-VI compound semiconductor such as CdZnMgTeSe-based material. If this is the case, the advantages of the twenty-fourth to twenty-sixth embodiments can be preserved. Further, the aluminum composition ratio in the active layer may be changed, not fixed at 0.5, so that the LED may emit visible light ranging from the red region to the green region. Still further, the material for the light-emitting region is not limited to the III-V compound semiconductor specified above. Rather, any other III-V compound semiconductor or II-VI compound semiconductor can be used.

In the sixteenth to twenty-third embodiments, II-VI compound semiconductor is used. Instead, III-V compound semiconductor may be utilized. If so, the compound semiconductor selected should be of cubic crystal. This is because a layer of hexahedral crystal can hardly be lattice-matched with any other layer, possibly decreasing the luminous intensity of the light and reducing the reliability of the device.

The present invention is not limited to any embodiment described above. For example, the embodiments may be combined in any possible manner. Furthermore, various changes and modifications can be made without departing from the scope and spirit of the present invention.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A light-emitting semiconductor diode comprising:
   a first compound semiconductor layer of a first conductivity type provided on a top surface of a substrate;
   a central electrode provided on a first part of the first compound semiconductor layer;
   a second compound semiconductor layer of a second conductivity type provided above the top surface of the substrate covering a second part of the top surface of the first compound semiconductor layer, said second compound semiconductor layer surrounding all or nearly all of the central electrode and an exposed part of the first compound semiconductor layer lying between the central electrode and the second compound semiconductor layer;

a peripheral electrode provided on the second compound semiconductor layer, the peripheral electrode surrounding all or nearly all of the central electrode and the exposed part of the first compound semiconductor layer between the central electrode and the second compound semiconductor layer without any overlap between the peripheral electrode and the central electrode as viewed from above; and wherein light is produced from an area between opposing portions of the central and peripheral electrodes.

2. The diode according to claim 1, wherein said electrodes have a circular shape.

3. The diode according to claim 1, wherein said electrodes have a rectangular shape.

4. The diode according to claim 1, wherein said peripheral electrode is C-shaped and nearly surrounds said central electrode.

5. The diode according to claim 1, wherein said electrodes are electrically connected to a separate wiring substrate by bonding pads.

6. The diode according to claim 5, wherein said separate wiring substrate has light-reflecting extensions surrounding all sides of said first compound semiconductor layer and said second compound semiconductor layer.

7. The device according to claim 1, wherein said first and second compound semiconductor layers include gallium and nitrogen.

8. A light-emitting semiconductor diode comprising:

a first n-type compound semiconductor layer containing at least gallium and nitrogen and provided on a top surface of an insulating substrate;

a second p-type compound semiconductor layer of a second conductivity type containing at least gallium and nitrogen and provided covering only a central portion of the first n-type compound semiconductor layer;

a central electrode provided over and contacting a central part of the second p-type compound semiconductor layer;

a peripheral electrode provided on a peripheral portion of the first n-type compound semiconductor layer, said peripheral electrode being separated from and surrounding or nearly surrounding the central second p-type compound semiconductor layer and the central electrode along with an exposed portion of the first n-type compound semiconductor layer without any overlap between the peripheral electrode and the central electrode as viewed from above; and wherein light is provided from an area between opposing portions of the central and peripheral electrodes.

9. The diode according to claim 8, wherein said insulating substrate is transparent to light.

10. The diode according to claim 8, wherein said insulating substrate is opaque to light.

11. The diode according to claim 8, wherein said electrodes have a circular shape.

12. The diode according to claim 8, wherein said first and second electrodes have a rectangular shape.

13. The diode according to claim 8, wherein said peripheral electrode is C-shaped and nearly surrounds said central electrode.

14. The diode according to claim 8, wherein said electrodes are electrically connected to a separate wiring substrate by bonding pads.

15. The diode according to claim 14, wherein said separate wiring substrate has light-reflecting extensions surrounding all sides of said n-type compound semiconductor layer and said p-type compound semiconductor layer.

16. A laser diode comprising:

a first compound semiconductor cladding layer of a first conductivity type provided on top of a substrate;

a compound semiconductor active light emitting layer provided over only a central part of said first compound semiconductor cladding layer;

a second compound semiconductor cladding layer of a second conductivity type provided over the active layer;

a central electrode provided on a central part of said second compound semiconductor cladding layer; and a peripheral electrode provided on a peripheral part of said first compound semiconductor cladding layer at least partly surrounding but not in contact with said centrally located active layer covered by said second compound semiconductor cladding layer and the central electrode without any overlap between the peripheral electrode and the central electrode as viewed from above; and wherein light is produced along side edge portions of the active layer.

17. The laser diode according to claim 16, wherein said central electrode is of a rectangular shape and that part of said peripheral electrode which surrounds said central electrode on the surrounding part of the first compound semiconductor cladding layer has a corresponding shape.

18. The laser diode according to claim 16, wherein at least part of the side edge portions of the active layer and corresponding side edge portions of the covering second compound semiconductor cladding layer are covered with a film made of a material which has a band gap larger than that of the active layer and a refractive index lower than that of the active layer.

19. The laser diode according to claim 18, wherein said film is a passivation film.

20. The laser diode according to claim 16, wherein said peripheral electrode has an upper surface which is lower in elevation than a corresponding elevation of said active layer.

21. The laser diode according to claim 16, wherein said central electrode is rectangular in shape, and said peripheral electrode surrounds at least three sides of said central rectangularly shaped electrode.

* * * * *